(12) United States Patent
Kim

(10) Patent No.: US 12,463,185 B2
(45) Date of Patent: Nov. 4, 2025

(54) DISPLAY DEVICE

(71) Applicant: Samsung Display Co., LTD., Yongin-si (KR)

(72) Inventor: Duk Sung Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 638 days.

(21) Appl. No.: 17/755,715

(22) PCT Filed: Sep. 3, 2020

(86) PCT No.: PCT/KR2020/011847
§ 371 (c)(1),
(2) Date: May 5, 2022

(87) PCT Pub. No.: WO2021/091061
PCT Pub. Date: May 14, 2021

(65) Prior Publication Data
US 2022/0406759 A1 Dec. 22, 2022

(30) Foreign Application Priority Data
Nov. 7, 2019 (KR) ........................ 10-2019-0141572

(51) Int. Cl.
*H01L 25/075* (2006.01)
*H10H 20/831* (2025.01)
*H10H 20/857* (2025.01)

(52) U.S. Cl.
CPC ..... *H01L 25/0753* (2013.01); *H10H 20/8312* (2025.01); *H10H 20/857* (2025.01)

(58) Field of Classification Search
CPC ..... H01L 33/00–648; H01L 27/15–156; H01L 2933/00–0091; H01L 25/0753;
(Continued)

(56) References Cited

U.S. PATENT DOCUMENTS 11,004,922 B2  5/2021  You et al.
11,063,238 B2  7/2021  Lee et al.
(Continued)

FOREIGN PATENT DOCUMENTS

CN   106992201 A   7/2017
CN   108155300 A   6/2018
(Continued)

OTHER PUBLICATIONS

International Search Report of PCT/KR2020/011847, Dec. 15, 2020, 4 pages.
(Continued)

*Primary Examiner* — Matthew C Landau
*Assistant Examiner* — Nora T. Nix
(74) *Attorney, Agent, or Firm* — Womble Bond Dickinson (US) LLP

(57) ABSTRACT

A display device includes a substrate; a first bank structure and a second bank structure spaced from each other on the substrate; a first electrode on the first bank structure and a second electrode on the second bank structure; and a light emitting element located between the first electrode and the second electrode, wherein the first bank structure includes a base layer, an upper layer on the base layer, and an intermediate layer between the base layer and the upper layer, and the first electrode covers the first bank structure.

21 Claims, 27 Drawing Sheets

(58) Field of Classification Search
CPC . H01L 29/4908; H01L 29/66742–6678; H01L 29/786–78696; H01L 27/12–13; H01L 2924/13069; H01L 33/36–42; H01L 33/44; H01L 33/60; H01L 33/46; H01L 33/405; H10K 10/46–491; H10K 59/122; H10K 50/856; H10K 50/878; H10K 59/173; H10H 20/00–882; H10H 29/00–142; H10H 29/30–962
See application file for complete search history.

(56) References Cited

U.S. PATENT DOCUMENTS

| | | | |
|---|---|---|---|
| 11,367,823 B2 | 6/2022 | Kim et al. | |
| 11,393,964 B2 | 7/2022 | Kim et al. | |
| 11,744,102 B2 | 8/2023 | Lee et al. | |
| 11,811,012 B2 | 11/2023 | Kim et al. | |
| 2013/0119413 A1 | 5/2013 | Harada et al. | |
| 2016/0163765 A1* | 6/2016 | Hu | H10H 20/8506 438/34 |
| 2017/0294451 A1 | 10/2017 | Kim et al. | |
| 2018/0019369 A1* | 1/2018 | Cho | H01L 33/38 |
| 2018/0175009 A1 | 6/2018 | Kim et al. | |
| 2018/0175106 A1* | 6/2018 | Kim | H10H 20/84 |
| 2019/0172819 A1 | 6/2019 | Bae et al. | |
| 2019/0237452 A1* | 8/2019 | Kuo | H10H 20/855 |
| 2019/0244985 A1 | 8/2019 | Kim et al. | |
| 2020/0037442 A1* | 1/2020 | Keum | H05K 1/118 |
| 2024/0063359 A1 | 2/2024 | Kim et al. | |

FOREIGN PATENT DOCUMENTS

| | | |
|---|---|---|
| KR | 2013-0072969 A | 7/2013 |
| KR | 2017-0117282 A | 10/2017 |
| KR | 10-2018-0011982 A | 2/2018 |
| KR | 2019-0067296 A | 6/2019 |
| KR | 10-2019-0124359 A | 11/2019 |
| WO | WO 2019/208880 A1 | 10/2019 |

OTHER PUBLICATIONS

Chinese Office Action for CN Application No. 202080077041.4, dated Nov. 27, 2024, 8 pages.

\* cited by examiner

DISPLAY DEVICE

CROSS-REFERENCE TO RELATED APPLICATIONS

This application is a U.S. National Phase Patent Application of International Patent Application Number PCT/KR2020/011847, filed on Sep. 3, 2020, which claims priority to Korean Patent Application Number 10-2019-0141572, filed on Nov. 7, 2019, the entire contents of all of which are incorporated by reference herein.

BACKGROUND

1. Field

The present disclosure relates to a display device.

2. Description of the Related Art

The importance of display devices has steadily increased with the development of multimedia technology. In response thereto, various types of display devices such as an organic light emitting diode (OLED) display, a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY one or more embodiments of the present disclosure provide a display device including an emission area in which light emitting elements are disposed and a non-emission area in which circuit elements are disposed.

One or more embodiments of the present disclosure also provide a display device of which the number of manufacturing processes is decreased by forming members disposed in an emission area and a non-emission area in the same process.

It should be noted that aspects of the present disclosure are not limited thereto and other aspects, which are not mentioned herein, will be apparent to those of ordinary skill in the art from the following description.

According to one or more embodiments of the disclosure, a display device includes a substrate, a first bank structure and a second bank structure spaced from each other on the substrate, a first electrode on the first bank structure and a second electrode on the second bank structure, and a light emitting element located between the first electrode and the second electrode, wherein the first bank structure includes a base layer, an upper layer on the base layer, and an intermediate layer between the base layer and the upper layer, and the first electrode covers the first bank structure.

An emission area and a non-emission area may be defined in the substrate, and the first bank structure, the second bank structure, and the light emitting element may be located in the emission area.

The display device may further include a first transistor in the non-emission area of the substrate and including a first active material layer, a first gate electrode on the first active material layer, and a source/drain electrode in contact with at least a partial area of the first active material layer, wherein the first gate electrode may be at a same layer as the base layer of the first bank structure.

The source/drain electrode of the first transistor may be at the same layer as the upper layer of the first bank structure.

The first electrode may be at least partially located in the non-emission area, and a portion of the first electrode located in the non-emission area may be in contact with the source/drain electrode of the first transistor.

The display device may further include a third bank structure in the emission area of the substrate and located between the first bank structure and the second bank structure, and a third electrode on the third bank structure.

The light emitting element may include a first light emitting element located between the first bank structure and the third bank structure and a second light emitting element located between the third bank structure and the second bank structure, the first light emitting element may include one end electrically connected to the first electrode, and the second light emitting element may include one end electrically connected to the second electrode.

The display device may further include a first planarization layer on the source/drain electrode in the non-emission area and an external bank layer surrounding the first bank structures in the emission area.

A height from an upper surface of the substrate to an upper surface of the first planarization layer may be substantially the same as a height from the upper surface of the substrate to an upper surface of the external bank layer.

The intermediate layer of the first bank structure surrounds an outer surface of the base layer.

The upper layer may overlap at least a partial area of the base layer in a thickness direction with the intermediate layer interposed therebetween.

The display device may further include a first insulating layer on at least partial areas on the first electrode and the second electrode, wherein the first insulating layer may be located so as not to overlap at least a partial area of a portion of the first electrode located on the first bank structure.

The display device may further include a second insulating layer on at least a partial area of the first insulating layer, wherein the second insulating layer may be located so that a portion of the first electrode that does not overlap the first insulating layer is exposed.

The light emitting element may be located on the first insulating layer, and at least a portion of the second insulating layer may be located on the light emitting element, and may be located so that both ends of the light emitting element are exposed.

The display device may further include a first contact electrode on the first electrode and a second contact electrode on the second electrode, wherein the first contact electrode may be in direct contact with a portion of the first electrode that does not overlap the first insulating layer and the second insulating layer, and be in direct contact with the exposed one end of the light emitting element.

According to one or more embodiments of the disclosure, a display device includes a substrate including an emission area and a non-emission area, a first semiconductor layer in the non-emission area of the substrate and including a first active material layer of a first transistor, a first gate insulating layer on the substrate and the first semiconductor layer, a first gate conductive layer on the first gate insulating layer and including a first gate electrode of the first transistor in the non-emission area and a plurality of base layers in the emission area, an interlayer insulating layer including a first interlayer insulating layer on the first gate electrode and a plurality of intermediate layers covering the plurality of base layers, a first data conductive layer including a source/drain electrode of the first transistor on the first interlayer insulating layer and a plurality of upper layers located on the intermediate layer, a plurality of electrodes having at least partial areas on the upper layers and spaced from and opposing each other, and at least one light emitting element located between the plurality of electrodes.

The plurality of base layers may include a first base layer and a second base layer spaced from each other, the plurality of intermediate layers may include a first intermediate layer covering the first base layer and a second intermediate layer covering the second base layer, and the plurality of upper layers may include a first upper layer on the first intermediate layer and a second upper layer on the second intermediate layer.

The plurality of electrodes may include a first electrode on the first upper layer and covering the first base layer and the first intermediate layer and a second electrode on the second upper layer and covering the second base layer and the second intermediate layer, and the light emitting element may be electrically connected to the first electrode and the second electrode.

The display device may further include a first contact electrode on the first electrode and a second contact electrode on the second electrode, the first contact electrode may be in direct contact with the first electrode and one end of the light emitting element, and the second contact electrode may be in direct contact with the second electrode and the other end of the light emitting element.

The first electrode may be at least partially located in the non-emission area, and a portion of the first electrode located in the non-emission area is in contact with the source/drain electrode of the first transistor.

The display device may further include a first insulating layer covering at least partial areas on the first electrode and the second electrode, wherein the light emitting element may be on the first insulating layer.

The display device may further a second insulating layer on at least a partial area of the first insulating layer, wherein at least a portion of the second insulating layer may be on the light emitting element, and be located so that both ends of the light emitting element are exposed.

The display device may further include a planarization layer on the first data conductive layer, wherein the planarization layer may include a first planarization layer covering the non-emission area and an external bank layer surrounding an outer surface of the emission area.

The details of other embodiments are included in the detailed description and the accompanying drawings.

A display device according to an embodiment may include a bank structure including a base layer and an upper layer formed at the same layer as a gate conductive layer and a data conductive layer disposed in a non-emission area. The bank structure may be disposed in an emission area to form an area in which the light emitting elements are disposed.

According to an embodiment; the number of manufacturing processes of the display device may be decreased by forming the bank structure disposed in the emission area in the same process as circuit elements or wirings of the non-emission area.

The effects, aspects, and features according to one or more embodiments of the present disclosure are not limited by the contents exemplified above, and more various effects, aspects, and features are included in this disclosure.

DETAILED DESCRIPTION

The present disclosure will now be described more fully hereinafter with reference to the accompanying drawings, in which one or more embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
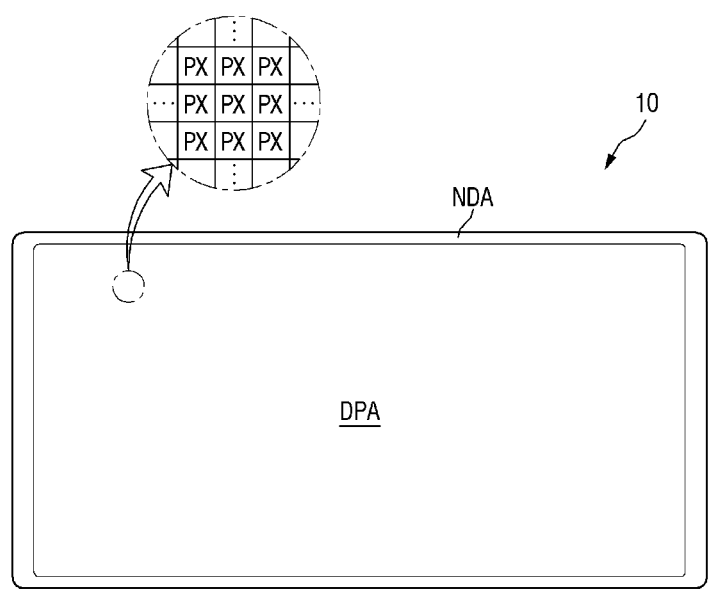
FIG. 1 is a plan view of a display device according to one or more embodiments.

FIG. 1 is a schematic plan view of a display device according to one or more embodiments.

Referring to FIG. 1, a display device 10 displays a moving image or a still image. The display device 10 may refer to all electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the display device 10.

The display device 10 includes a display panel providing the display screen. Examples of the display panel may include a light emitting diode (LED) display panel, an organic light emitting display panel, a quantum dot light emitting display panel, a plasma display panel, a field emission display panel, and the like. Hereinafter, a case where the LED display panel is applied as an example of the display panel will be described by way of example, but the present disclosure is not limited thereto, and the same technical idea may be applied to other display panels if applicable.

A shape of the display device 10 may be variously modified. For example, the display device 10 may have a shape such as a rectangular shape with a width greater than a length, a rectangular shape with a length greater than a width, a square shape, a rectangular shape with rounded corners (vertices), other polygonal shapes, or a circular shape. A shape of a display area DPA of the display device 10 may also be similar to an overall shape of the display device 10. In FIG. 1, the display device 10 and the display area DPA having the rectangular shape with the width greater than the length are illustrated.

The display device 10 may include a display area DPA and non-display areas NDA. The display area DPA is an area in which an image may be displayed, and the non-display areas NDA are areas in which no image is displayed. The display area DPA may also be referred to as an active area, and the non-display area NDA may also be referred to as a non-active area. The display area DPA may occupy substantially the center of the display device 10.

The display area DPA may include a plurality of pixels PX. The plurality of pixels PX may be arranged in a matrix direction. For example, the plurality of pixels PX may be arranged along rows and columns of a matrix. A shape of each pixel PX may be a rectangular shape or a square shape in a plan view, but is not limited thereto, and may also be a rhombic shape of which each side is inclined with respect to one direction. The respective pixels PX may be alternately arranged in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light emitting elements 300 (e.g., see, FIG. 5) emitting light of a specific wavelength band to display a specific color.

The non-display areas NDA may be disposed around the display area DPA along the edge or periphery of the display area DPA. The non-display areas NDA may entirely or partially surround the display area DPA. The display area DPA may have a rectangular shape, and the non-display areas NDA may be disposed adjacent to four sides of the display area DPA. The non-display areas NDA may constitute a bezel of the display device 10.

Figure 2:
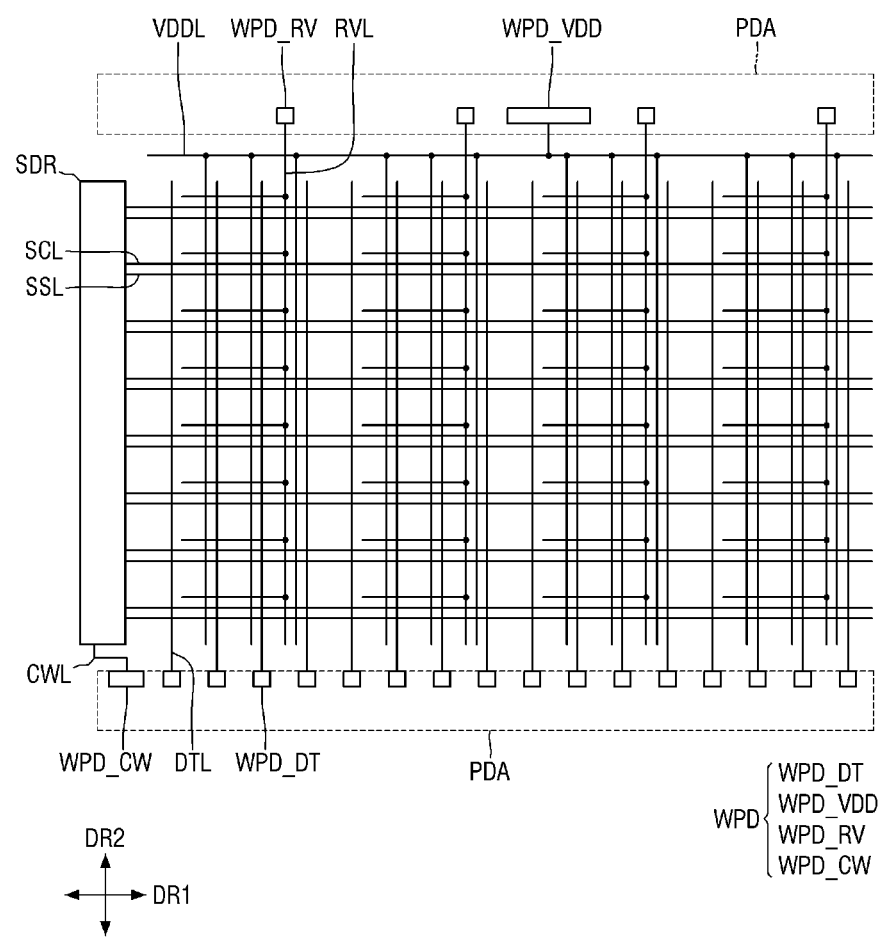
FIG. 2 is a schematic plan view illustrating wirings included in the display device according to one or more embodiments.

FIG. 2 is a schematic plan view illustrating wirings included in the display device according to one or more embodiments.

Referring to FIG. 2, the display device 10 may include a plurality of wirings. The plurality of wirings may include scan lines SCL, sensing lines SSL, data lines DTL, reference voltage lines RVL, and a first voltage line VDDL. In addition, the plurality of wirings may further include a second voltage line VSSL.

The scan lines SCL and the sensing lines SSL may extend in a first direction DR1. The scan lines SCL and the sensing lines SSL may be connected to a scan driver SDR. The scan driver SDR may include a driving circuit. The scan driver SDR may be disposed on the other side of the display area DPA in the first direction DR1, for example, on the left side of the display area DPA, among the non-display areas NDA, but is not limited thereto. The scan driver SDR may be connected to a signal connection wiring CWL, and at least one end of the signal connection wiring CWL may be connected to an external device by forming a pad WPD_CW on the non-display area NDA.

The data lines DTL and the reference voltage lines RVL may extend in the second direction DR2 crossing the first direction DR1. The first voltage line VDDL may include portions extending in the second direction DR2. In addition, the first voltage line VDDL may further include portions extending in the first direction DR1. Accordingly, the first voltage line VDDL may have a mesh structure, but is not limited thereto. In one or more embodiments, the second voltage line VSSL may also include portions extending in the second direction DR2 and portions extending in the first direction DR1, like the first voltage line VDDL.

Wiring pads VVPD may be disposed at at least one ends of the data lines DTL, the reference voltage lines RVL, and the first voltage line VDDL. Each wiring pad WPD may be disposed in the non-display area NDA. In one or more embodiments, wiring pads VVPD_DT (hereinafter, referred to as 'data pads') of the data lines DTL may be disposed in a non-display area NDA positioned on the lower side of the display area DPA, which is the other side of the display area DPA in the second direction DR2, and wiring pads VVPD_RV (hereinafter, referred to as 'reference voltage pads') of the reference voltage lines RVL and a wiring pad VVPD_VDD (hereinafter, referred to as a 'first power pad') of the first voltage line VDDL may be disposed in a non-display area NDA positioned on the upper side of the display area DPA, which is one side of the display area DPA in the second direction DR2. As another example, all of the data pads WPD_DT, the reference voltage pads VVPD_RV, and the first power pad VVPD_VDD may be disposed in the same area, for example, the non-display area NDA positioned on the upper side of the display area DPA. As described above, the external device may be mounted on the wiring pad VVPD. The external device may be mounted on the wiring pad VVPD through an anisotropic conductive film, ultrasonic bonding, or the like.

Each pixel PX of the display device 10 includes a pixel driving circuit. The above-described wirings may apply driving signals to the respective pixel driving circuits while passing through the respective pixels PX or around the respective pixels PX. The pixel driving circuit may include a transistor and a capacitor. The numbers of transistors and capacitors in each pixel driving circuit may be variously modified. Hereinafter, the pixel driving circuit will be described using a 3T1C structure in which the pixel driving circuit includes three transistors and one capacitor as an example, but the present disclosure is not limited thereto, and structures of various other modified pixels PX such as a 2T1C structure, a 7T1C structure, and a 6T1C structure may also be applied.

Figure 3:
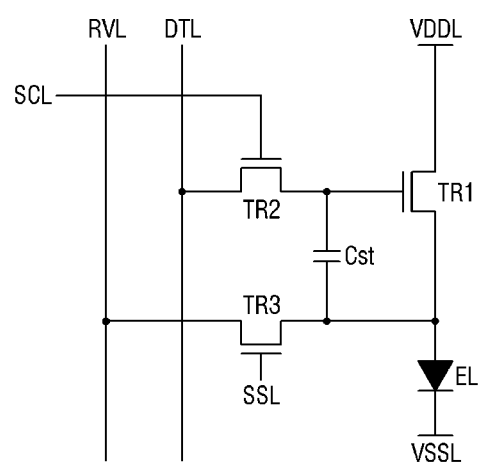
FIG. 3 is an equivalent circuit diagram of one pixel included in the display device according to one or more embodiments.

FIG. 3 is an equivalent circuit diagram of one pixel included in the display device according to one or more embodiments.

Referring to FIG. 3, each pixel PX of the display device according to one or more embodiments includes three transistors TR1, TR2, and TR3 and one storage capacitor Cst, in addition to a light emitting element EL.

The light emitting element EL emits light according to a current supplied through a first transistor TR1. A detailed description of the light emitting element EL will be provided later.

One end of the light emitting element EL may be connected to a first source/drain electrode of the first transistor TR1, and the other end of the light emitting element EL may be connected to the second voltage line VSSL to which a low potential voltage (e.g., a second source voltage) VSS lower than a high potential voltage (e.g., a first source voltage) VDD of the first voltage line VDDL is supplied.

The first transistor TR1 adjusts a current flowing from the first voltage line VDDL to which the first source voltage is supplied to the light emitting element EL according to a voltage difference between a gate electrode and a source electrode thereof. A gate electrode of the first transistor TR1 may be connected to a first source/drain electrode of a second transistor TR2, the first source/drain electrode of the first transistor TR1 may be connected to a first electrode of the light emitting element EL, and a second source/drain electrode of the first transistor TR1 may be connected to the first voltage line VDDL to which the first source voltage VDD is applied.

The second transistor TR2 is turned on by a scan signal of the scan line SCL to connect the data line DTL to the gate electrode of the first transistor TR1. A gate electrode of the second transistor TR2 may be connected to the scan line SCL, the first source/drain electrode of the second transistor TR2 may be connected to the gate electrode of the first transistor TR1, and a second source/drain electrode of the second transistor TR2 may be connected to the data line DTL.

A third transistor TR3 is turned on by a sensing signal of the sensing line SSL to connect the reference voltage line RVL to the first source/drain electrode of the first transistor TR1. A gate electrode of the third transistor TR3 may be connected to the sensing signal line SSL, a first source/drain electrode of the third transistor TR3 may be connected to the reference voltage line RVL, and a second source/drain electrode of the third transistor TR3 may be connected to the first source/drain electrode of the first transistor TR1.

In one or more embodiments, the first source/drain electrode of each of the first to third transistors TR1, TR2, and TR3 may be a source electrode, and the second source/drain electrode of each of the first to third transistors TR1 TR2, and TR3 may be a drain electrode, but the present disclosure is not limited thereto, and vice versa.

The capacitor Cst is formed between the gate electrode and the first source/drain electrode of the first transistor TR1. The storage capacitor Cst stores a difference voltage between a gate voltage and a first source/drain voltage of the first transistor TR1.

In addition, each of the first to third transistors TR1, TR2, and TR3 may be formed as a thin film transistor (TFT). Further, it has been mainly described in FIG. 3 that each of the first to third transistors TR1, TR2, and TR3 is formed as an N-type metal oxide semiconductor field effect transistor (MOSFET), but the present disclosure is not limited thereto. That is, each of the first to third transistors TR1 TR2, and TR3 may be formed as a P-type MOSFET or some of the first to third transistors TR1, TR2, and TR3 may be formed as an N-type MOSFET and the others of the first to third transistors TR1, TR2, and TR3 may be formed as a P-type MOSFET.

Hereinafter, a structure of one pixel PX of the display device 10 according to one or more embodiments will be described in detail with reference to other drawings.

Figure 4:
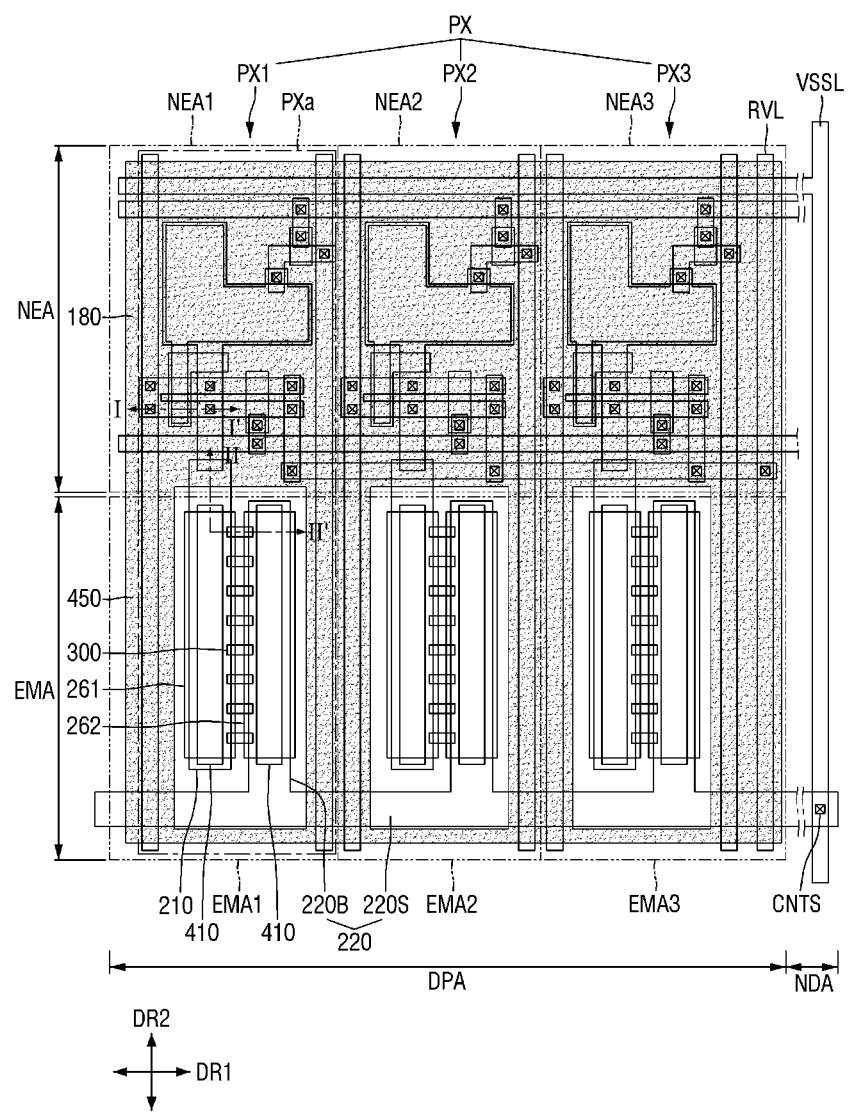
FIG. 4 is a layout diagram illustrating one pixel of the display device according to one or more embodiments.

FIG. 4 is a layout diagram illustrating one pixel of the display device according to one or more embodiments.

Referring to FIG. 4, each of the plurality of pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the present disclosure is not limited thereto, and the respective sub-pixels PXn may also emit light of the same color. In addition, it has been illustrated in FIG. 4 that the pixel PX includes three sub-pixels PXn, but the present disclosure is not limited thereto, and the pixel PX may include a larger number of sub-pixels PXn.

In addition, each of the pixels PX of the display device 10 may include an emission area EMA and a non-emission area NEA. The first sub-pixel PX1 may include a first emission area EMA1 and a first non-emission area NEA1, the second sub-pixel PX2 may include a second emission area EMA2 and a second non-emission area NEA2, and the third sub-pixel PX3 may include a third emission area EMA3 and a third non-emission area NEA3. The emission area EMA may be defined as an area in which light emitted from the light emitting elements 300 disposed in each pixel PX is emitted. As described later, the light emitting elements 300 include active layers 330 (e.g., see FIG. 7), which may emit light of specific wavelength bands without directionality. The light emitted from the active layers 330 of the light emitting elements 300 may be emitted in a lateral direction of the light emitting elements 300 as well as directions toward both ends of the light emitting element 300. The emission area EMA of each sub-pixel PXn may include an area in which the light emitting elements 300 are disposed, and include an area which is adjacent to the light emitting elements 300 and in which the light emitted from the light emitting elements 300 is emitted. In addition, the present disclosure is not limited thereto, and the emission area EMA may also include an area in which the light emitted from the light emitting elements 300 is reflected or refracted by other members and then emitted.

Each pixel PX or sub-pixel PXn includes a pixel driving circuit, which may be disposed in the non-emission area NEA of each pixel PX or sub-pixel PXn. That is, the non-emission area NEA may be an area in which circuit elements constituting the pixel driving circuit of each pixel PX or sub-pixel PXn or a plurality of wirings are disposed. In addition, the non-emission area NEA may be an area other than the emission area EMA, and may be an area in which the light the emitted from the light emitting elements 300 does not arrive and thus, the light is not emitted. In the display device 10 according to an embodiment, the light emitting elements 300 emitting the light and the circuit elements for driving the light emitting elements 300 may be disposed in different areas, for example, the emission area EMA and the non-emission area NEA, and may not overlap each other in a thickness direction. Accordingly, the display device 100 may emit the light to an upper surface or a rear surface of the area in which the light emitting elements 300 are disposed. Furthermore, as described later, bank structures 410 and 420 (see FIG. 4) providing the area in which the light emitting elements 300 are disposed may be formed in the same process as the circuit elements or the wirings of the non-emission area NEA, and the number of manufacturing processes of the display device 10 may be decreased.

Hereinafter, an arrangement of components included in each pixel PX or sub-pixel PXn will be described in more detail with reference to other drawings.

Figure 5:
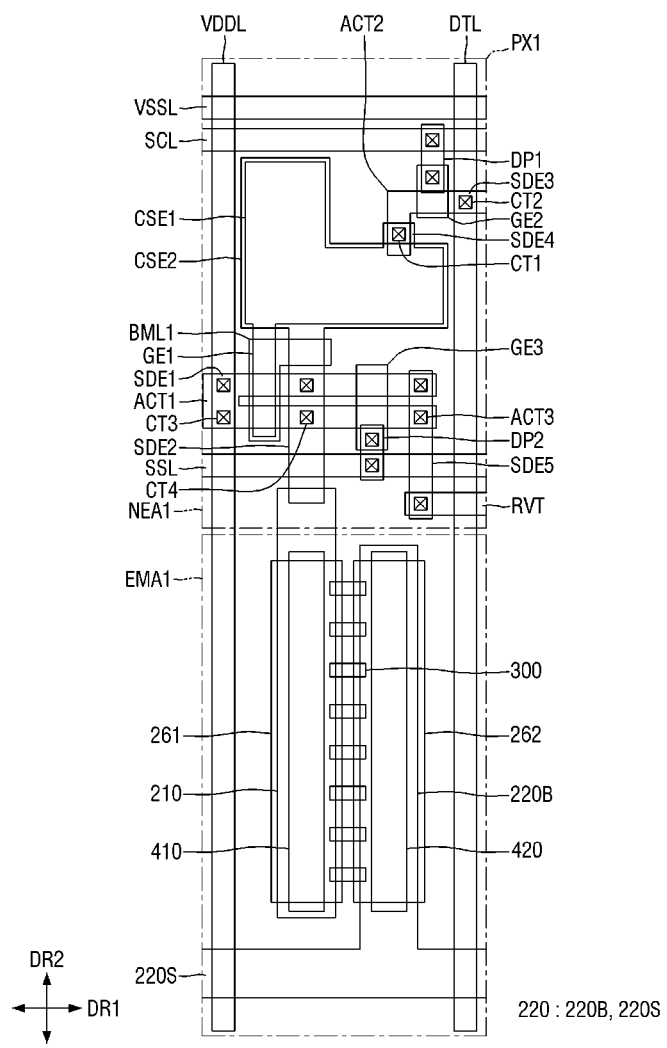
FIG. 5 is a layout diagram illustrating one sub-pixel of FIG. 4.
Figure 6:
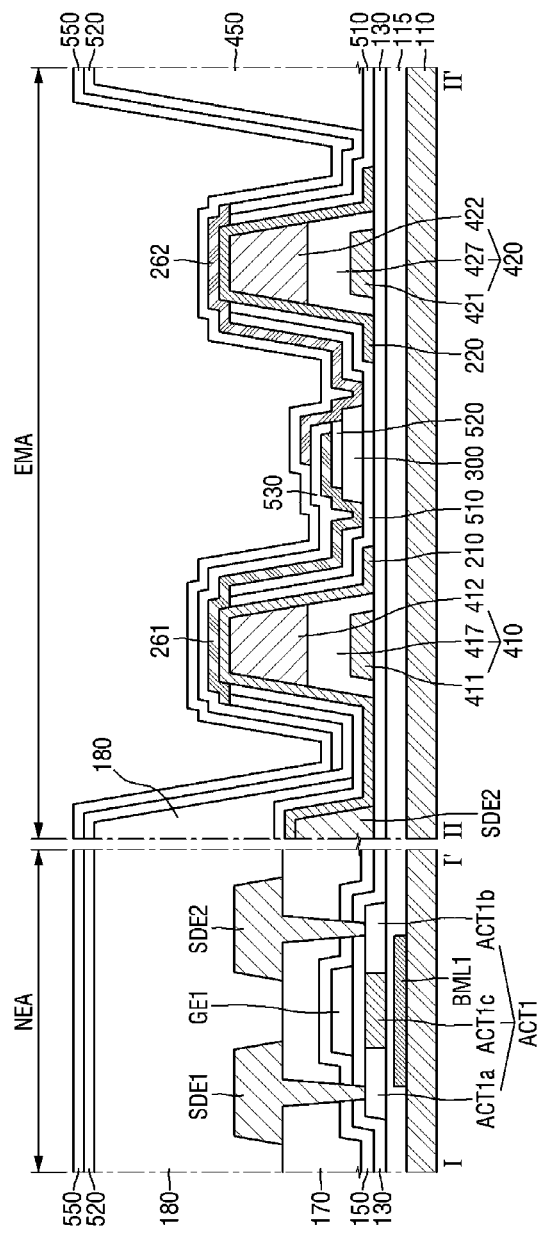
FIG. 6 is a cross-sectional view taken along the lines I-I' and of FIG. 4.

FIG. 5 is a layout diagram illustrating one sub-pixel of FIG. 4. FIG. 6 is a cross-sectional view taken along the lines I-I' and II-II' of FIG. 4. In FIG. 5, for convenience of explanation, an external bank layer 450 (see FIG. 4) and a first planarization layer 180 (see FIG. 4) disposed in each sub-pixel PXn are omitted. Portion I-I' of FIG. 6 is a cross section of a portion of the non-emission areas NEA of each sub-pixel PXn, and portion II-II' of FIG. 6 is a cross section of a portion of the emission area EMA of each sub-pixel PXn.

Referring to FIGS. 5 and 6 in addition to FIG. 4, each pixel PX or sub-pixel PXn of the display device 10 may include a first substrate 110, and a semiconductor layer, a plurality of conductive layers, and a plurality of insulating layers disposed on the first substrate 110. The plurality of conductive layers may include a first gate conductive layer, a first data conductive layer, an electrode, and a contact electrode, and the plurality of insulating layers may include a buffer layer 115, a first gate insulating layer 130, a first passivation layer 150, a first interlayer insulating layer 170, a first planarization layer 180, a first insulating layer 510, a second insulating layer 520, a third insulating layer 530, and a fourth insulating layer 550. The plurality of conductive layers and the semiconductor layer may constitute the transistors TR1, TR2, and TR3 and the storage capacitor Cst of each pixel PX described above with reference to FIG. 3, a plurality of signal lines or voltage lines, and the like. FIG. 6 illustrates only a cross section of the first transistor TR1 of the circuit elements disposed in the non-emission area NEA. A description of other transistors of each sub-pixel PXn, for example, the second transistor TR2 and the third transistor TR3 will be omitted.

First, the first substrate 110 may be an insulating substrate. The first substrate 110 may be made of an insulating material such as glass, quartz, or a polymer resin. In addition, the first substrate 110 may be a rigid substrate, but may also be a flexible substrate that may be bent, folded, or rolled. The emission area EMA and the non-emission area NEA may be defined in the first substrate 110, the light emitting element 300 may be disposed in the emission area EMA of the first substrate 110, and the first transistor TR1 or the like may be disposed in the non-emission area NEA of the first substrate 110 as the circuit element.

A first light blocking layer BML1 may be disposed on the first substrate 110. The first light blocking layer BML1 may be disposed in the non-emission area NEA of the first substrate 110, and may be disposed to overlap a portion of a first active material layer ACT of a first transistor TR1 to be described later in a thickness direction of the first substrate 110. The first light blocking layer BML1 may include a light blocking material to prevent light from being incident on the first active material layer ACT. As an example, the first light blocking layer BUM may be formed of an opaque metal material blocking transmission of the light. However, the present disclosure is not limited thereto, and in some cases, the first light blocking layer BML1 may be omitted.

The buffer layer 115 is disposed on the first substrate 110 as well as on the first light blocking layer BILI. The buffer layer 115 may be disposed in the entirety of the non-emission area NEA and the emission area EMA of the first substrate 110. The buffer layer 115 may be formed on the first substrate 110 in order to protect the transistors TR1, TR2, and TR3 of the pixel PX from water vapor permeating through the first substrate 110 vulnerable to water vapor permeation, and may perform a surface planarization function. The buffer layer 115 may include a plurality of inorganic layers that are alternately stacked. For example, the buffer layer 115 may be formed as multiple layers in which one or more inorganic layers of a silicon oxide layer ($SiO_x$), a silicon nitride layer ($SiN_x$), and silicon oxynitride ($SiO_xN_y$) are alternately stacked.

The semiconductor layer is disposed on the buffer layer 115. The semiconductor layer may be disposed in the non-emission area NEA of each pixel PX or sub-pixel PXn to constitute an active material layer of each of the transistors TR1, TR2, and TR3. The semiconductor layer may include a first active material layer ACT1 of the first transistor TR1, a second active material layer ACT2 of the second transistor TR2, and a third active material layer ACTS of the third transistor TR3.

These active layers may be disposed to partially overlap gate electrodes GE1, GE2, and GE3 of a first gate conductive layer to be described later. Based on the center of the non-emission area NEA of the sub-pixel PXn in the drawing, the second active material layer ACT2 may be disposed on the upper side, which is one side of the center in the second direction DR2, and the first active material layer ACT1 and the third active material layer ACT3 may be disposed on the lower side, which is the other side of the center in the second direction DR2. As illustrated in the drawings, the first active material layer ACT1 of the first transistor TR1 and the third active material layer ACT3 of the third transistor TR3 may be formed integrally as a single semiconductor layer, a portion of the single semiconductor layer may be the first active material layer ACT1, and the other portion of the single semiconductor layer may be the third active material layer ACT3.

In one or more embodiments, the semiconductor layer may include polycrystalline silicon, single crystal silicon, an oxide semiconductor, or the like. When the semiconductor layer includes the polycrystalline silicon, the first active material layer ACT1 may include a first doped region ACT1a, a second doped region ACT1b, and a first channel region ACT1c. The first doped region ACT1a and the second doped region ACT1b may be regions doped with impurities. The first channel region ACT1c may be disposed between the first doped region ACT1a and the second doped region ACT1b. The polycrystalline silicon may be formed by crystallizing amorphous silicon. Examples of the crystallization method include a rapid thermal annealing (RTA) method, a solid phase crystallization (SPC) method, an excimer laser annealing (ELA) method, a metal induced crystallization (MILC) method, a sequential lateral solidification (SLS) method, and the like, but are not limited thereto. As another example, the first active material layer ACT1 may include single crystal silicon, low-temperature polycrystalline silicon, amorphous silicon, or the like.

However, the first active material layer ACT1 is not necessarily limited to those described above. In one or more embodiments, the first active material layer ACT1 may include an oxide semiconductor. In this case, the first doped region ACT1*a* may be a first conductive region, and the second doped region ACT1*b* may be a second conductive region. When the first active material layer ACT1 includes the oxide semiconductor, the oxide semiconductor may be an oxide semiconductor containing indium (In). In one or more embodiments, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc tin oxide (IGZTO), or the like. However, the present disclosure is not limited thereto.

The first gate insulating layer 130 is disposed on the semiconductor layer and the buffer layer 115. The first gate insulating layer 130 may be disposed on the buffer layer 115 as well as on the semiconductor layer, that is, the first to third active material layers ACT1, ACT2, and ACT3. That is, the first gate insulating layer 130 may be entirely disposed on the non-emission area NEA and the emission area EMA. The first gate insulating layer 130 may function as a gate insulating film of the first to third transistors TR1, TR2, and TR3. The first gate insulating layer 130 may be formed of an inorganic material, for example, silicon oxide ($SiO_x$) or silicon nitride ($SiN_x$) or be formed in a structure in which silicon oxide ($SiO_x$) and silicon nitride ($SiN_x$) are stacked.

The first gate conductive layer is disposed on the first gate insulating layer 130. The first gate conductive layer may include the gate electrodes GE1, GE2, and GE3 of the first to third transistors TR1, TR2, and TR3, the scan line SCL, the sensing line SSL, the second voltage line VSSL, a reference voltage distribution line RVT, and a first capacitance electrode CSE1 of the storage capacitor Cst that are disposed in the non-emission area NEA and base layers 411 and 421 of the bank structures 410 and 420 that are disposed in the emission area EMA.

First, the gate electrodes GE1, GE2, and GE3 of the first to third transistors TR1, TR2, and TR may be disposed to overlap the first to third active material layers ACT1, ACT2, and ACT3, respectively, in the thickness direction of the first substrate 110. A first gate electrode GE1 may overlap at least a partial area of the first active material layer ACT1, a second gate electrode GE2 may overlap at least a partial area of the second active material layer ACT2, and a third gate electrode GE3 may overlap at least a partial area of the third active material layer ACT3. The first gate electrode GE1 may be electrically connected to a first capacitance electrode CSE1 of a storage capacitor Cst to be described later. The second gate electrode GE2 may be electrically connected to a scan line SCL to be described later, and the third gate electrode GE3 may be electrically connected to a sensing line SSL to be described later.

The scan line SCL may extend in the first direction DR1 to be disposed beyond a boundary between neighboring sub-pixels PXn. That is, a plurality of pixels PX or sub-pixels PXn neighboring to each other in the first direction DR1 may share one scan line SCL with each other. The scan line SCL may be disposed on the upper side, which is one side in the second direction DR2, with respect to the center of the non-emission area NEA of the sub-pixel PXn. The scan line SCL may be electrically connected to the second gate electrode GE2 of the second transistor TR2 through a portion of a first data conductive layer to be described later, and may transfer a scan signal to the second transistor TR2.

The sensing line SSL may also extend in the first direction DR1 to be disposed beyond a boundary between the neighboring sub-pixels PXn. That is, the plurality of pixels PX or sub-pixels PXn neighboring to each other in the first direction DR1 may share one sensing line SSL with each other. The sensing line SSL may be disposed on the lower side, which is the other side in the second direction DR2, with respect to the center of the non-emission area NEA of the sub-pixel PXn. The sensing line SSL may be electrically connected to the third gate electrode GE3 of the third transistor TR3 through a portion of a first data conductive layer to be described later, and may transfer a sensing signal to the third transistor TR3.

The reference voltage distribution line RVT may be disposed on the other side of the sensing line SSL in the second direction DR2, and may extend in the first direction DR1. The reference voltage distribution line RVT may be disposed to extend from the first sub-pixel PX1 to the third sub-pixel PX3, and each pixel PX, that is, three sub-pixels PXn may share one reference voltage distribution line RVT with each other. The reference voltage distribution line RVT may be electrically connected to a reference voltage line RVL to be described later and a first source/drain electrode of the third transistor TR3 of each sub-pixel PXn. Accordingly, the reference voltage distribution line RVT may transfer a reference voltage applied from the reference voltage line RVL to the third transistor TR3.

The second voltage line VSSL may be disposed on one side of the scan line SCL in the second direction DR2, and may extend in the first direction DR1. In addition, the second voltage line VSSL may be disposed in the non-display area NDA of the display device 10 and may further include portions extending in the second direction DR2. Portions of the second voltage line VSSL extending in the second direction DR2 may be connected to the above-described wiring pads WPD, and accordingly, the second source voltage VSS may be applied. The second voltage line VSSL may be electrically connected to a second electrode 220 (see FIG. 4) to be described later to apply the second source voltage VSS to the light emitting element 300. Although it has been illustrated in FIG. 4 that the second voltage line VSSL and the second electrode 220 are connected to each other in the non-display area NDA, the present disclosure is not limited thereto. In one or more embodiments, the second electrodes 220 of the respective sub-pixels PXn may be electrically connected to the second voltage line VSSL at portions of the second voltage line VSSL extending in the first direction DR1, respectively.

The first capacitance electrode CSE1 of the storage capacitor Cst is disposed between the scan line SCL and the sensing line SSL. The first capacitance electrode CSE1 of the storage capacitor Cst may be electrically connected to the first gate electrode GE1 of the first transistor TR1 and a second source/drain electrode SDE4 of the second transistor TR2.

The second source/drain electrode SDE4 of the second transistor TR2 may be in contact with one side of the second active material layer ACT2 through a first contact hole CT1 in an area thereof overlapping one side of the second active material layer ACT2. The second source/drain electrode SDE4 may be connected to the first capacitance electrode CSE1 of the storage capacitor Cst.

In one or more embodiments, the display device 10 may include bank structures 410 and 420 disposed in the emission area EMA, and the light emitting elements 300 may be disposed between the bank structures 410 and 420. The bank structures 410 and 420 may include a first bank structure 410 and a second bank structure 420. The first bank structure 410 and the second bank structure 420 may be disposed for each sub-pixel PXn to form an area in which the light emitting elements 300 are disposed in the emission area EMA.

The bank structures 410 and 420 may have a multilayer structure in which a plurality of layers are stacked. According to one or more embodiments, the bank structures 410 and 420 may include base layers 411 and 421, intermediate layers 417 and 427, and upper layers 412 and 422, respectively. Here, the base layers 411 and 421 may be disposed at the same layer as the first gate conductive layer, that is, the first gate electrode GE1 of the first transistor TR1. That is, the first gate conductive layer may further include the base layers 411 and 421 of the bank structures 410 and 420 disposed in the emission area EMA.

The first bank structure 410 and the second bank structure 420 include a first base layer 411 and a second base layer 421, respectively, and each of the first base layer 411 and the second base layer 421 is directly disposed on the first gate insulating layer 130 positioned in the emission area EMA. The first base layer 411 and the second base layer 421 may extend in the second direction DR2 in the emission area EMA of each sub-pixel PXn, and may be disposed to be spaced from and face each other in the first direction DR1. Lengths of the first base layer 411 and the second base layer 421 measured in the second direction DR2 may be substantially the same as each other. Other layers may be further disposed on the first base layer 411 and the second base layer 421, and the first base layer 411 and the second base layer 421 and other layers may form the bank structures 410 and 420, respectively.

However, the first base layer 411 and the second base layer 421, which are disposed in the emission area EMA in order to form the bank structures 410 and 420, may not be electrically connected to the circuit elements and the wirings disposed in the non-emission area NEA. That is, the first base layer 411 and the second base layer 421 may be disposed at the first gate conductive layer, but may be electrically insulated from the circuit elements and the wirings, and may be disposed in the emission area EMA in order to provide an area in which the light emitting elements 300 are disposed. A more detailed description of the bank structures 410 and 420 will be provided later.

The first gate conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, the present disclosure is not limited thereto.

The first passivation layer 150 is disposed on the first gate conductive layer. The first passivation layer 150 may be disposed in the non-emission area NEA to cover the active material layers ACT1, ACT2, and ACTS of the first to third transistors TR1, TR2, and TR3, a plurality of signal lines, and the like. The first passivation layer 150 may be formed of an inorganic material, for example, silicon oxide (SiO) or silicon nitride ($SiN_x$) or be formed in a structure in which silicon oxide ($SiO_x$) and silicon nitride ($SiN_x$) are stacked.

An interlayer insulating layer is disposed on the first passivation layer 150 and the base layers 411 and 421 of the bank structures 410 and 420. The interlayer insulating layer may include the first interlayer insulating layer 170 disposed on the first passivation layer 150 of the non-emission area NEA and the intermediate layers 417 and 427 of the bank structures 410 and 420 are disposed on the base layers 411 and 421 of the emission area EMA, respectively. The first interlayer insulating layer 170 and the intermediate layers 417 and 427 of the bank structures 410 and 420 may be disposed at the same layer and may be formed in the same process.

The intermediate layers 417 and 427 of bank structures 410 and 420 may include a first intermediate layer 417 disposed on the first base layer 411 and a second intermediate layer 427 disposed on the second base layer 421. The first intermediate layer 417 and the second intermediate layer 427 may be disposed at the same layer as the first interlayer insulating layer 170 disposed in the non-emission area NEA, and may be disposed to cover the first base layer 411 and the second base layer 421, respectively. The intermediate layers 417 and 427 are disposed to cover the outer surfaces of the base layers 411 and 421, respectively, such that portions of lower surfaces of the intermediate layers 417 and 427 may be in direct contact with the first gate insulating layer 130.

The first interlayer insulating layer 170 may function as an insulating film between the first gate conductive layer and other layers disposed on the first interlayer insulating layer 170.

The first interlayer insulating layer 170 and the intermediate layers 417 and 427 may be formed of an inorganic material, for example, silicon oxide ($SiO_x$) or silicon nitride ($SiN_x$) or be formed in a structure in which silicon oxide ($SiO_x$) and silicon nitride ($SiN_x$) are stacked.

The first data conductive layer is disposed on the first interlayer insulating layer 170 and the intermediate layers 417 and 427. The first data conductive layer may include the data line DTL, the first voltage line VDDL, the reference voltage line RVL, first source/drain electrodes SDE1, SDE3, and SDE5 and second source/drain electrodes SDE2 and SDE4 of the first to third transistors TR1 TR2, and TR3, a plurality of conductive patterns DP1 and DP2, a second capacitance electrode CSE2 of the storage capacitor Cst, and the upper layers 412 and 422 of the bank structures 410 and 420. The data line DTL, the first voltage line VDDL, and the reference voltage line RVL of the first data conductive layer may be disposed over the non-emission area NEA and the emission area EMA, the first source/drain electrodes SDE1, SDE3, and SAE5 and the second source/drain electrodes SDE2 and SDE4 of the first to third transistors TR1, TR2, and TR3, the plurality of conductive patterns DP1 and DP2, and the second capacitance electrode CSE2 of the storage capacitor Cst of the first data conductive layer may be disposed in the non-emission area NEA, and the upper layers 412 and 422 of the bank structures 410 and 420 of the first data conductive layer may be disposed in the emission area EMA.

The data line DTL may extend in the second direction DR2 to be disposed beyond a boundary between neighboring sub-pixels PXn. For example, a plurality of pixels PX or sub-pixels PXn neighboring to each other in the second direction DR2 may share one data line DTL with each other. The data line DTL may be disposed on the right side, which is one side in the first direction DR1, with respect to the center of the non-emission area NEA of the sub-pixel PXn. The data line DTL may be in contact with one side of the second active material layer ACT2 of the second transistor TR2 through a second contact hole CT2. That is, a portion of the data line DTL may be the first source/drain electrode SDE3 of the second transistor TR2, and accordingly, a data signal applied to the data line DTL may be transferred to the second transistor TR2.

The first voltage line VDDL may also extend in the second direction DR2 to be disposed beyond a boundary between the neighboring sub-pixels PXn. For example, the plurality of pixels PX or sub-pixels PXn neighboring to each other in the second direction DR2 may share one first voltage line VDDL with each other. The first voltage line VDDL may be disposed on the left side, which is the other side in the first direction DR1, with respect to the center of the non-emission area NEA of the sub-pixel PXn. The first voltage line VDDL may be in contact with one side of the first active material layer ACT1 of the first transistor TR1 through a third contact hole CT3. That is, a portion of the first voltage line VDDL may be the first source/drain electrode SDE1 of the first transistor TR1, and accordingly, the first source voltage VDD applied to the first voltage line VDDL may be transferred to the first transistor TR1.

The first voltage line VDDL and the data line DTL may be disposed for each sub-pixel PXn. As illustrated in the drawing, the first voltage line VDDL and the data line DTL may be disposed, respectively, on the left side and the right side with respect to the center of each sub-pixel PXn, and may extend in the second direction DR2 to be disposed over the non-emission area NEA and the emission area EMA. The first voltage line VDDL and the data line DTL disposed in the emission area EMA may be disposed below an external bank layer 450 to be described later.

One reference voltage line RVL may be disposed in one pixel PX, that is, every three sub-pixels PXn. For example, the reference voltage line RVL may be disposed on the left side, which is one side of the data line DTL of the third sub-pixel PXn in the first direction DR1, and may extend in the second direction DR2. The plurality of pixels PX neighboring to each other in the second direction DR2 may share one reference voltage line RVL with each other. The reference voltage line RVL may be electrically connected to the above-described reference voltage distribution line RVT, and the reference voltage applied through the reference voltage line RVL may be transferred to the third transistor TR3 of each sub-pixel PXn through the reference voltage distribution line RVT.

The second capacitance electrode CSE2 of the storage capacitor Cst is disposed between the first voltage line VDDL and the data line DTL. The second capacitance electrode CSE2 of the storage capacitor Cst may be disposed to overlap the first capacitance electrode CSE1, and the storage capacitor Cst may be formed between the first capacitance electrode CSE1 and the second capacitance electrode CSE2. The second capacitance electrode CSE2 of the storage capacitor Cst may be connected to the second source/drain electrode SDE2 of the first transistor TR1. The second source/drain electrode SDE2 of the first transistor TR1 may be in contact with the first light blocking layer BML1 and a portion of the first active material layer ACT1 through a fourth contact hole CT4. In addition, the second source/drain electrode SDE2 of the first transistor TR1 may also be in contact with one side of the third active material layer ACT3 of the third transistor TR3 to constitute a second source/drain electrode of the third transistor TR3.

The first source/drain electrode SDE5 of the third transistor TR3 may be in contact with one side of the third active material layer ACT3 and the reference voltage distribution line RVT. The first source/drain electrode SDE5 of the third transistor TR3 may receive the reference voltage from the reference voltage distribution line RVT.

A first conductive pattern DP1 and a second conductive pattern DP2 of the first data conductive layer may be connected to portions of the first gate conductive layer. The first conductive pattern DP1 may be connected to the scan line SCL and the second gate electrode GE2 of the second transistor TR2, and may transfer the scan signal applied from the scan line SCL to the second gate electrode GE2 of to the second transistor TR2. The second conductive pattern DP2 may be connected to the sensing line SSL and the third gate electrode GE3 of the third transistor TR3, and may transfer the sensing signal applied from the sensing line SSL to the third gate electrode GE3 of the third transistor TR3.

In one or more embodiments, the bank structures 410 and 420 may include the upper layers 412 and 422 disposed on the intermediate layers 417 and 427, respectively, and the upper layers 412 and 422 may be disposed at the same layer as the source/drain electrodes SDE1 and SDE2 of the first transistor TR1. That is, the first data conductive layer may further include the upper layers 412 and 422 of the bank structures 410 and 420 disposed in the emission area EMA.

The first bank structure 410 and the second bank structure 420 include a first upper layer 412 and a second upper layer 422, respectively, and the first upper layer 412 and the second upper layer 422 are directly disposed respectively on the first intermediate layer 417 and the second intermediate layer 427 positioned in the emission area EMA. The first upper layer 412 and the second upper layer 422 may have the same shape as the first base layer 411 and the second base layer 421, respectively. For example, the first upper layer 412 and the second upper layer 422 may extend in the second direction DR2 in the emission area EMA of each sub-pixel PXn, and may be disposed to be spaced from and face (or oppose) each other in the first direction DR1. The base layers 411 and 421, the intermediate layers 417 and 427, and the upper layers 412 and 422 may form the bank structures 410 and 420, respectively, and electrodes 210 and 220 to be described later may be disposed on the bank structures 410 and 420, respectively.

However, like the base layers 411 and 421, the first upper layer 412 and the second upper layer 422, which are disposed in the emission area EMA in order to form the bank structures 410 and 420, may not be electrically connected to the circuit elements and the wirings disposed in the non-emission area NEA. That is, the first upper layer 412 and the second upper layer 422 may be disposed at the first data conductive layer, but may be electrically insulated from the circuit elements and the wirings, and may be disposed in the emission area EMA in order to provide an area in which the light emitting elements 300 is disposed.

Describing the bank structures 410 and 420 in detail, the first bank structure 410 and the second bank structure 420 may be disposed adjacent to a central portion of the emission area EMA of each sub-pixel PXn, and may be disposed to be spaced from and face (or oppose) each other in the first direction DR1. In addition, the first bank structure 410 and the second bank structure 420 may extend in the second direction DR2 in the emission area EMA of each sub-pixel PXn, but may terminate so as not to extend to other sub-pixels PXn neighboring in the second direction DR2. As an example, the first bank structure 410 and the second bank structure 420 may be disposed for each sub-pixel PXn to form a pattern in the entirety of the display device 10. The bank structures 410 and 420 are disposed to be spaced from and face (or oppose) each other in the emission area EMA, such that an area in which the light emitting elements 300 are disposed may be formed between the bank structures 410 and 420. It has been illustrated in the drawings that one first bank structure 410 and one second bank structure 420 are disposed, but the present disclosure is not limited thereto. In some cases, a plurality of bank structures 410 and a plurality of bank structures 420 may be disposed according to the number of electrodes 210 and 220 to be described later or larger numbers of other bank structures 410 and 420 may be further disposed.

In the display device 10 according to one or more embodiments, components disposed in the emission area EMA of each pixel PX or sub-pixel PXn, for example, the bank structures 410 and 420 may be disposed at the same layer as components disposed in the non-emission area NEA, for example, the gate electrodes GE1, GE2, and GE3 or the source/drain electrodes of the transistors TR1, TR2, and TR3. In the display device 10 according to one or more embodiments, the circuit elements for driving the light emitting elements 300 and the bank structures 410 and 420 providing the area in which the light emitting elements 300 are disposed may be formed in the same process, and thus, the number of manufacturing processes of the display device 10 may be decreased. In addition, the light emitting element 300 emitting the light and the circuit element for driving the light emitting element 300, for example, the first transistor TR1 may be disposed so as not to overlap each other in the thickness direction, and the display device 10 may emit light toward an upper surface or a rear surface of the first substrate 110 on which the light emitting element 300 is disposed.

In addition, the first bank structure 410 and the second bank structure 420 are formed in a multilayer structure in which a plurality of layers are stacked, and may thus have a structure in which at least portions thereof protrude from the upper surface of the first substrate 110 in the emission area EMA of the first substrate 110. The protruding portions of the first bank structure 410 and the second bank structure 420 may have inclined side surfaces, and the light emitted from the light emitting elements 300 disposed between the first bank structure 410 and the second bank structure 420 may travel toward the inclined side surfaces of the bank structures 410 and 420. As described later, when the electrodes 210 and 220 disposed on the bank structures 410 and 420 include a material having high reflectivity, the light emitted from the light emitting elements 300 may be reflected on the side surfaces of the bank structures 410 and 420 and may be emitted in an upward direction of the first substrate 110. That is, the bank structures 410 and 420 may function as reflective partition walls reflecting the light emitted from the light emitting elements 300 toward the upward direction while providing the area in which the light emitting elements 300 are disposed.

A plurality of electrodes 210 and 220 and the first insulating layer 510 may be disposed on the first data conductive layer of the emission area EMA. The display device 10 according to one or more embodiments may include the plurality of electrodes 210 and 220 disposed on the bank structures 410 and 420 and a plurality of light emitting elements 300 disposed between the plurality of electrodes 210 and 220. The plurality of electrodes 210 and 220 may include a first electrode 210 disposed on the first bank structure 410 and a second electrode 220 disposed on the second bank structure 420.

As illustrated in FIG. 5, the first electrode 210 may be disposed to extend in the second direction DR2 within the emission area EMA of each sub-pixel PXn. The first electrode 210 does not extend to other sub-pixels PXn neighboring in the second direction DR2, and may be disposed to be spaced from the external bank layer 450 around (or surrounding) the emission area EMA of each sub-pixel PXn. In addition, at least a partial area of the first electrode 210 may be disposed in the non-emission area NEA. The first electrode 210 may be electrically connected to the first transistor TR1 through a portion thereof disposed in the non-emission area NEA. As an example, as illustrated in FIG. 6, the portion disposed in the non-emission area NEA of the first electrode 210 may be in direct contact with the second source/drain electrode SDE2 of the first transistor TR1. The first electrodes 210 disposed in the respective sub-pixels PXn may receive different electrical signals from the respective first transistors TR1. Although it has been illustrated in the drawing that the first electrode 210 is disposed to partially cover the second source/drain electrode SDE2 of the first transistor TR1, the present disclosure is not limited thereto. In one or more embodiments, at least one layer may be further disposed between the first electrode 210 and the first source/drain electrode SDE2, and the first electrode 210 may be in contact with the first source/drain electrode SDE2 through a contact hole penetrating through the at least one layer. In addition, in some cases, the first electrode 210 may be electrically connected to the first source/drain electrode SDE2 through a bridge disposed on another layer.

The second electrode 220 may include a second electrode stem part 220S disposed to extend in the first direction DR1 and a second electrode branch part 220B branching from the second electrode stem part 220S in the second direction DR2.

The second electrode stem part 220S may be disposed to extend in the first direction DR1 to traverse the other sub-pixels PXn. That is, a plurality of sub-pixels PXn or pixels PX neighboring to each other in the first direction DR1 may share one second electrode stem part 220S with each other. The second electrode stem part 220S may be electrically connected to the second voltage line VSSL. For example, in one or more embodiments, the second electrode stem part 220S may be electrically connected to the second voltage line VSSL through one electrode contact hole CNTS in the non-display area NDA positioned at an outer side portion of the display area DPA in which the plurality of pixels PX or sub-pixels PXn are disposed. Unlike the first electrodes 210, the second electrodes 220 may receive the same electrical signal in the pixels PX or sub-pixels PXn sharing one second electrode stem part 220S with each other. However, the present disclosure is not limited thereto, and in one or more embodiments, the second electrode stem part 220S may be omitted from the second electrode 220, and each of the second electrodes 220 disposed for each sub-pixel PXn may be electrically connected to the second voltage line VSSL.

The second electrode branch part 220E may be spaced from and face (or oppose) the first electrode 210 in the first direction DR1. The second electrode branch part 220E may extend in the second direction DR2, but may be spaced from the non-emission area NEA so as not to be disposed in the non-emission area NEA.

The plurality of electrodes 210 and 220 may be electrically connected to the light emitting elements 300, and may receive a suitable voltage (e.g., a set or predetermined voltage) so that the light emitting elements 300 emits the light. For example, the plurality of electrodes 210 and 220 may be electrically connected to the light emitting elements 300 through contact electrodes 261 and 262 to be described later, and electrical signals applied to the electrodes 210 and 220 may be transferred to the light emitting elements 300 through the contact electrodes 261 and 262. In addition, at least a portion of each of the electrodes 210 and 220 may be utilized to form an electric field in the sub-pixel PXn in order to align the light emitting elements 300.

In one or more embodiments, the first electrode 210 may be a pixel electrode separated for each sub-pixel PXn, and the second electrode 220 may be a common electrode commonly connected along each sub-pixel PXn. One of the first electrode 210 and the second electrode 220 may be an anode electrode of the light emitting element 300, and the other one of the first electrode 210 and the second electrode 220 may be a cathode electrode of the light emitting element 300. However, the first electrode 210 and the second electrode 220 are not limited thereto, and vice versa.

As illustrated in FIG. 6, the first electrode 210 may be disposed on the first bank structure 410, and a portion of the second electrode 220 or the second electrode branch part 220E may be disposed on the second bank structure 420. The first electrode 210 and the second electrode 220 may be disposed to cover the first bank structure 410 and the second bank structure 420, respectively. For example, widths of the first electrode 210 and the second electrode 220 measured in one direction may be greater than widths of the first bank structure 410 and the second bank structure 420 measured in the one direction, such that the first electrode 210 and the second electrode 220 may be disposed to cover outer surfaces of the first bank structure 410 and the second bank structure 420, respectively. Accordingly, portions of lower surfaces of the first electrode 210 and the second electrode 220 may be in contact with the first gate insulating layer 130, and the other portions of the lower surfaces of the first electrode 210 and the second electrode 220 may be in contact with the bank structures 410 and 420, respectively.

Each of the electrodes 210 and 220 may include a transparent conductive material. As an example, each of the electrodes 210 and 220 may include a material such as indium tin oxide (ITO), indium zinc oxide (IZO), or indium tin zinc oxide (ITZO), but is not limited thereto. In one or more embodiments, each of the electrodes 210 and 220 may include a conductive material having high reflectivity. For example, each of the electrodes 210 and 220 may include a metal such as silver (Ag), copper (Cu), or aluminum (Al) as the material having the high reflectivity. In this case, light incident on each of the electrodes 210 and 220 may be reflected to be emitted in an upward direction of each sub-pixel PXn.

In addition, the electrodes 210 and 220 may have a structure in which one or more layers made of the transparent conductive material and one or more layers made of the metal having the high reflectivity are stacked or may be formed as one layer including the transparent conductive material and the metal having the high reflectivity. In one or more embodiments, each of the electrodes 210 and 220 may have a stacked structure of ITO/silver (Ag)/ITO/IZO or may be made of an alloy including aluminum (Al), nickel (Ni), lanthanum (La), and the like. However, the present disclosure is not limited thereto.

Although it has been illustrated in the drawings that one first electrode 210 and one second electrode 220 are disposed in each sub-pixel PXn, the present disclosure is not limited thereto. Like the bank structures 410 and 420, larger numbers of the first electrodes 210 and the second electrodes 220 may be disposed. In addition, the first electrode 210 and the second electrode 220 do not necessarily have a shape in which they extend in one direction, and may be disposed in various structures. For example, the first electrode 210 and the second electrode 220 may have a partially curved or bent shape, and any one of the first electrode 210 and the second electrode 220 may be disposed to be around (or to surround) the other one of the first electrode 210 and the second electrode 220. The first electrode 210 and the second electrode 220 are not particularly limited in arrangement structures and shapes thereof as long as at least partial areas thereof are spaced from and face (or oppose) each other and accordingly, an area in which the light emitting elements 300 are to be disposed is formed between the first electrode 210 and the second electrode 220.

The first insulating layer 510 may be entirely disposed in the emission area BMA, and may be disposed so that a partial area of each of the electrodes 210 and 220 is exposed. The first insulating layer 510 may be not only disposed in an area between the electrodes 210 and 220 or the bank structures 410 and 420 that are spaced from each other, but may also be disposed on the outer sides opposite to the area with respect to the bank structures 410 and 420. However, the first insulating layer 510 may include openings formed to expose portions of upper surfaces of the first electrode 210 and the second electrode 220. The openings of the first insulating layer 510 may be formed so that partial areas of portions of the first electrode 210 and the second electrode 220 put on the bank structures 410 and 420 are exposed.

The first insulating layer 510 may insulate the first electrode 210 and the second electrode 220 from each other while protecting the first electrode 210 and the second electrode 220. In addition, the first insulating layer 510 may prevent the light emitting elements 300 disposed on the first insulating layer 510 from being in direct contact with and being damaged by other members. However, a shape and a structure of the first insulating layer 510 are not limited thereto.

The first planarization layer 180 is disposed on the first data conductive layer of the non-emission area NEA, and the external bank layer 450 is disposed on the first insulating layer 510 of the emission area EMA. The first planarization layer 180 and the external bank layer 450 may be disposed at the same layer and may thus be concurrently (e.g., simultaneously) formed in one process. Accordingly, in one or more embodiments, heights from the first substrate 110 to upper surfaces of the first planarization layer 180 and the external bank layer 450 may have substantially the same as each other. However, the present disclosure is not limited thereto.

The first planarization layer 180 may be disposed to entirely cover the first data conductive layer in the non-emission area NEA. The first planarization layer 180 may serve to planarize a step formed due to the circuit elements disposed in the non-emission area NEA while protecting the first data conductive layer.

The external bank layer 450 may be disposed on a partial area of the emission area EMA, and may be formed in the same process as the first planarization layer 180 of the non-emission area NEA. However, as illustrated in FIGS. 4 and 6, the first planarization layer 180 may be disposed to entirely cover the non-emission area NEA, but the external bank layer 450 may be disposed so that a partial area of the emission area EMA is exposed.

For example, the external bank layer 450 may be disposed at a boundary between the respective sub-pixels PXn. The external bank layer 450 may be disposed to extend in the first direction DR1 and the second direction DR2, and may be disposed to be around (e.g., surround) the bank structures 410 and 420 and the electrodes 210 and 220 as well as the area in which the light emitting elements 300 are disposed between the bank structures 410 and 420 and the electrodes 210 and 220. That is, the external bank layer 450 may form a lattice pattern in the entirety of the display area DPA. According to one or more embodiments, a height of the external bank layer 450 may be greater than a height of the bank structures 410 and 420. The external bank layer 450 may serve to prevent ink from overflowing into adjacent sub-pixels SPXn in an inkjet process of disposing the light emitting elements 300 among manufacturing processes of the display device 10 as described later while dividing the neighboring sub-pixels PXn.

The light emitting elements 300 may be disposed between the first electrode 210 and the second electrode 220. One end of the light emitting element 300 may be electrically connected to the first electrode 210, and the other end of the light emitting element 300 may be electrically connected to the second electrode 220. The light emitting element 300 may have both ends electrically connected to contact electrodes 261 and 262 to be described later, and may be electrically connected to the first electrode 210 and the second electrode 220 through the contact electrodes 261 and 262, respectively.

The plurality of light emitting elements 300 may be disposed to be spaced from each other, and may be aligned substantially parallel to each other. An interval between the light emitting elements 300 spaced from each other is not particularly limited. In some cases, a plurality of light emitting elements 300 may be disposed adjacent to each other and may be grouped, and a plurality of other light emitting elements 300 may be grouped in a state in which they are spaced from the plurality of light emitting elements 300 by a suitable interval (e.g., a set or predetermined interval) or a plurality of light emitting elements 300 may have a non-uniform density, but may be oriented and aligned in one direction. In addition, in one or more embodiments, the light emitting elements 300 may have a shape in which they extend in one direction, and a direction in which the respective electrodes, for example, the first electrode 210 and the second electrode branch part 220B extend, and a direction in which the light emitting elements 300 extend may be substantially perpendicular to each other. However, the present disclosure is not limited thereto, and the light emitting elements 300 are not perpendicular to the direction in which the respective electrodes extend, and may also be disposed to be oblique to the direction in which the respective electrodes extend.

The light emitting elements 300 according to one or more embodiments may include active layers 330 including different materials to emit light of different wavelength bands to the outside. The display device 10 according to one or more embodiments may include the light emitting elements 300 emitting light of different wavelength bands. The light emitting element 300 of the first sub-pixel PX1 may include an active layer 330 emitting first light L1 of which a central wavelength band is a first wavelength, the light emitting element 300 of the second sub-pixel PX2 may include an active layer 330 emitting second light L2 of which a central wavelength band is a second wavelength, and the light emitting element 300 of the third sub-pixel PX3 may include an active layer 330 emitting third light L3 of which a central wavelength band is a third wavelength.

Accordingly, the first light L1 may be emitted from the first sub-pixel PX1, the second light L2 may be emitted from the second sub-pixel PX2, and the third light L3 may be emitted from the third sub-pixel PX3. In one or more embodiments, the first light L1 may be blue light having a central wavelength band in the range of 450 nm to 495 nm, the second light L2 may be green light having a central wavelength band in the range of 495 nm to 570 nm, and the third light L3 may be red light having a central wavelength band in the range of 620 nm to 752 nm.

However, the present disclosure is not limited thereto. In some cases, each of the first sub-pixel PX1, the second sub-pixel PX2, and the third sub-pixel PX3 may also include the same type of light emitting elements 300 to emit light of substantially the same color.

The light emitting elements 300 may be disposed on the first insulating layer 510 between the respective electrodes 210 and 220. For example, the light emitting elements 300 may be disposed on the first insulating layer 510 disposed between the bank structures 410 and 420. However, the present disclosure is not limited thereto, and at least some of the light emitting elements 300 disposed in each sub-pixel PXn may also be in an area other than an area formed between the bank structures 410 and 420, for example, between the bank structures 410 and 420 and the external bank layer 450. In addition, the light emitting elements 300 may be disposed so that partial areas thereof overlap the respective electrodes 210 and 220 in the thickness direction of the first substrate 110. In this case, one end of the light emitting element 300 may be disposed on the first electrode 210, and the other end of the light emitting element 300 may be disposed on the second electrode 220.

In one or more embodiments, the light emitting element 300 may include a plurality of layers disposed in a direction parallel to an upper surface of the first substrate 110 or the first insulating layer 510. The light emitting element 300 of the display device 10 according to one or more embodiments may have a shape in which it extends in one direction, and may have a structure in which a plurality of semiconductor layers are sequentially disposed in one direction. The light emitting element 300 may be disposed so that one direction in which the light emitting element 300 extends is parallel to the first insulating layer 510, and the plurality of semiconductor layers included in the light emitting element 300 may be sequentially disposed along the direction parallel to the upper surface of the first insulating layer 510. However, the present disclosure is not limited thereto. In some cases, when the light emitting element 300 has another structure, the plurality of layers may be disposed in a direction perpendicular to the first insulating layer 510. A more detailed description of a structure of the light emitting element 300 will be provided later with reference to other drawings.

The second insulating layer 520 may be disposed on the first planarization layer 180 of the non-emission area NEA and the external bank layer 450, portions of the bank structures 410 and 420, and the light emitting elements 300 of the emission area EMA. The second insulating layer 520 may be disposed to entirely cover the first planarization layer 180 in the non-emission area NEA, but may be disposed to expose both ends of the light emitting elements 300 and portions of the upper surfaces of the first electrode 210 and the second electrode 220 in the emission area EMA.

For example, the second insulating layer 520 may be partially disposed on the light emitting element 300 disposed between the first electrode 210 and the second electrode 220. A portion of the second insulating layer 520 disposed on the light emitting element 300 may have a shape in which it extends in the second direction DR2 between the first electrode 210 and the second electrode 220 of the emission area EMA. As an example, a partial area of the second insulating layer 520 may form a stripe-shaped or island-shaped pattern in the emission area EMA of each sub-pixel PXn. The second insulating layer 520 may be disposed to partially surround an outer surface of the light emitting element 300 to serve to fix the light emitting element 300 in the manufacturing processes of the display device 10 while protecting the light emitting element 300. Here, the second insulating layer 520 may be disposed so that one end and the other end of the light emitting element 300 are exposed, and one end and the other end of the light emitting element 300 that are exposed may be in contact with contact electrodes 261 and 262 to be described later.

In addition, the second insulating layer 520 may be disposed to cover the external bank layer 450, the first electrode 210, and the second electrode 220, but may be disposed so that portions of the upper surfaces of the first electrode 210 and the second electrode 220 are exposed. The second insulating layer 520 may include openings formed to expose portions of the upper surfaces of the first electrode 210 and the second electrode 220, like the first insulating layer 510. The openings of the second insulating layer 520 may be disposed to overlap the openings of the first insulating layer 510. Accordingly, portions of the upper surfaces of the first electrode 210 and the second electrode 220 may be exposed because the first insulating layer 510 and the second insulating layer 520 are not disposed on portions of the upper surfaces of the first electrode 210 and the second electrode 220, and contact electrodes 261 and 262 to be described later may be disposed on the exposed portions.

A plurality of contact electrodes 261 and 262 and the third insulating layer 530 may be disposed on the second insulating layer 520 of the emission area EMA.

As illustrated in FIG. 5, the plurality of contact electrodes 261 and 262 may have a shape in which they extend in one direction. The plurality of contact electrodes 261 and 262 may be in contact with the light emitting elements 300 and the electrodes 210 and 220, respectively, and the light emitting elements 300 may receive electrical signals from the first electrode 210 and the second electrode 220 through the contact electrodes 261 and 262.

The contact electrodes 261 and 262 may include a first contact electrode 261 and a second contact electrode 262. The first contact electrode 261 and the second contact electrode 262 may be disposed on the first electrode 210 and the second electrode 220, respectively. The first contact electrode 261 may be disposed on the first electrode 210 and extend in the second direction DR2, and the second contact electrode 262 may be disposed on the second electrode 220 or the second electrode branch part 220B and extend in the second direction DR2. The first contact electrode 261 and the second contact electrode 262 may be spaced from and face (or oppose) each other in the first direction DR1, and may form a stripe-shaped pattern in the emission area EMA of each sub-pixel PXn.

In one or more embodiments, widths of the first contact electrode 261 and the second contact electrode 262 measured in one direction may be equal to or greater than widths of the first electrode 210 and the second electrode 220 or the second electrode branch part 220B measured in the one direction, respectively. The first contact electrode 261 and the second contact electrode 262 may be disposed to cover the upper surfaces of the first electrode 210 and the second electrode 220 while being in contact with one end and the other end of the light emitting element 300, respectively. However, the present disclosure is not limited thereto, and in some cases, the first contact electrode 261 and the second contact electrode 262 may also be disposed to cover only portions of the first electrode 210 and the second electrode 220, respectively.

According to one or more embodiments, the light emitting element 300 may have semiconductor layers exposed on an end surface thereof in one direction in which it extends, and the first contact electrode 261 and the second contact electrode 262 may be in contact with the light emitting element 300 on the end surface on which the semiconductor layers are exposed. However, the present disclosure is not limited thereto. In some cases, side surfaces of both ends of the light emitting element 300 may be partially exposed. An insulating film 380 (e.g. see FIG. 7) surrounding outer surfaces (e.g., outer peripheral or circumferential surfaces) of the semiconductor layers of the light emitting element 300 may be partially removed in a process of forming the second insulating layer 520 covering the outer surface of the light emitting element 300 among the manufacturing processes of the display device 10, and an exposed side surface of the light emitting element 300 may be in contact with the first contact electrode 261 and the second contact electrode 262.

It has been illustrated in the drawings that one first contact electrode 261 and one second contact electrode 262 are disposed in one sub-pixel PXn, but the present disclosure is not limited thereto. The numbers of first contact electrodes 261 and second contact electrodes 262 may be changed depending on the numbers of first electrodes 210 and second electrodes 220 disposed in each sub-pixel PXn.

As illustrated in FIG. 6, the first contact electrode 261 is disposed on the first electrode 210 and the second insulating layer 520. The first contact electrode 261 may be in contact with one end of the light emitting element 300 and the exposed upper surface of the first electrode 210. One end of the light emitting element 300 may be electrically connected to the first electrode 210 through the first contact electrode 261.

The third insulating layer 530 is disposed on the first contact electrode 261. The third insulating layer 530 may electrically insulate the first contact electrode 261 and the second contact electrode 262 from each other. The third insulating layer 530 may be disposed to cover the first contact electrode 261; but may not be disposed on the other end of the light emitting element 300 so that the light emitting element 300 may be in contact with the second contact electrode 262. The third insulating layer 530 may be in partial contact with the first contact electrode 261 and the second insulating layer 520 on an upper surface of the second insulating layer 520. A side surface of the third insulating layer 530 in a direction in which the second electrode 220 is disposed may be aligned with one side surface of the second insulating layer 520. However, the present disclosure is not limited thereto.

The second contact electrode 262 is disposed on the second electrode 220, the second insulating layer 520, and the third insulating layer 530. The second contact electrode 262 may be in contact with the other end of the light emitting element 300 and the exposed upper surface of the second electrode 220. The other end of the light emitting element 300 may be electrically connected to the second electrode 220 through the second contact electrode 262.

That is, the first contact electrode 261 may be disposed between the first electrode 210 and the third insulating layer 530, and the second contact electrode 262 may be disposed on the third insulating layer 530. The second contact electrode 262 may be in partial contact with the second insulating layer 520, the third insulating layer 530, the second electrode 220, and the light emitting element 300. One end of the second contact electrode 262 in a direction in which the first electrode 210 is disposed may be disposed on the third insulating layer 530. The first contact electrode 261 and the second contact electrode 262 may not be in contact with each other by the second insulating layer 520 and the third insulating layer 530. However, the present disclosure is not limited thereto, and in some cases, the third insulating layer 530 may be omitted.

The contact electrodes 261 and 262 may include a conductive material. For example, the contact electrodes 261 and 262 may include ITO, IZO, ITZO, aluminum (Al), or the like. However, the present disclosure is not limited thereto.

The fourth insulating layer 550 may be entirely disposed over the emission area EMA and the non-emission area NEA on the first substrate 110. The fourth insulating layer 550 may serve to protect members disposed on the first substrate 110 from an external environment.

Each of the first insulating layer 510, the second insulating layer 520, the third insulating layer 530, and the fourth insulating layer 550 described above may include an inorganic insulating material or an organic insulating material. In one or more embodiments, the first insulating layer 510, the second insulating layer 520, the third insulating layer 530, and the fourth insulating layer 550 may include an inorganic insulating material such as silicon oxide ($SiO_x$), silicon nitride ($SiN_x$), silicon oxynitride ($SiO_xN_y$), aluminum oxide ($Al_2O_3$), or aluminum nitride (AlN). In addition, the first insulating layer 510, the second insulating layer 520, the third insulating layer 530, and the fourth insulating layer 550 may include an acrylic resin, an epoxy resin, a phenolic resin, a polyimide resin, a polyimide resin, an unsaturated polyester resin, a polyphenylene resin, a polyphenylene sulfide resin, benzocyclobutene, a cardo resin, a siloxane resin, a silsesquioxane resin, polymethylmethacrylate, polycarbonate, a polymethylmethacrylate-polycarbonate synthetic resin, and the like, as the organic insulating material. However, the present disclosure is not limited thereto.

In one or more embodiments, the light emitting elements 300 may be light emitting diodes. For example, the light emitting elements 300 may be inorganic light emitting diodes having a size of a micrometer or nanometer scale and made of an inorganic material. The inorganic light emitting diodes may be aligned between two electrodes in which polarities are formed when an electric field is formed in a specific direction between the two electrodes facing (or opposing) each other. The light emitting elements 300 may be aligned between the two electrodes by the electric field formed between the two electrodes.

The light emitting element 300 according to one or more embodiments may have a shape in which it extends in one direction. The light emitting element 300 may have a shape such as a rod shape, a wire shape, or a tube shape. In one or more embodiments, the light emitting element 300 may have a cylindrical shape or a rod shape. However, the light emitting element 300 is not limited to having the shape described above, and may have various shapes. For example, the light emitting element 300 may have a polygonal prismatic shape such as a cubic shape, a rectangular parallelepiped shape, or a hexagonal prismatic shape or have a shape in which it extends in one direction but has a partially inclined outer surface. A plurality of semiconductors included in a light emitting element 300 to be described later may have a structure in which they are sequentially disposed or stacked along the one direction.

The light emitting element 300 may include a semiconductor layer doped with any conductivity-type (e.g., p-type or n-type) impurities. The semiconductor layer may receive an electrical signal applied from an external power source and emit the electrical signal as light of a specific wavelength band.

Figure 7:
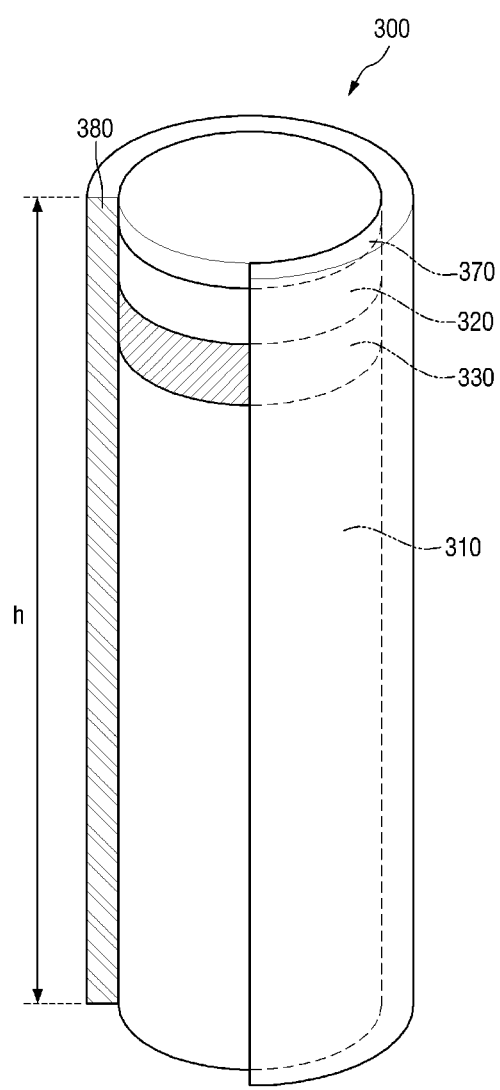
FIG. 7 is a schematic cutaway view of a light emitting element according to one or more embodiments.

FIG. 7 is a schematic view of a light emitting element according to one or more embodiments.

Referring to FIG. 7, the light emitting element 300 may include a first semiconductor layer 310, a second semiconductor layer 320, an active layer 330, an electrode layer 370, and an insulating film 380.

The first semiconductor layer 310 may be an n-type semiconductor. As an example, when the light emitting element 300 emits light of a blue wavelength band, the first semiconductor layer 310 may include a semiconductor material having a chemical formula of $Al_xGa_yIn_{1-x-y}N$ ($0 \le x \le 1$, $0 \le y \le 1$, and $0 \le x+y \le 1$). For example, the semiconductor material may be one or more of AlGaInN, GaN, AlGaN, InGaN, AlN, and InN doped with an n-type dopant. The first semiconductor layer 310 may be doped with an n-type dopant, which may be Si, Ge, Sn, or the like, as an example. In one or more embodiments, the first semiconductor layer 310 may be made of n-GaN doped with n-type Si. A length of the first semiconductor layer 310 may be in the range of 1.5 µm to 5 µm, but is not limited thereto.

The second semiconductor layer 320 is disposed on an active layer 330 to be described later. The second semiconductor layer 320 may be a p-type semiconductor, and as an example, when the light emitting element 300 emits light of a blue or green wavelength band, the second semiconductor layer 320 may include a semiconductor material having a chemical formula of $Al_xGa_yIn_{1-x-y}N$ ($0 \le x \le 1$, $0 \le y \le 1$, and $0 \le x+y \le 1$). For example, the semiconductor material may be one or more of AlGaInN, GaN, AlGaN, InGaN, AlN, and InN doped with a p-type dopant. The second semiconductor layer 320 may be doped with a p-type dopant, which may be Mg, Zn, Ca, Se, Ba, or the like, as an example. In one or more embodiments, the second semiconductor layer 320 may be made of p-GaN doped with p-type Mg. A length of the second semiconductor layer 320 may be in the range of 0.05 µm to 0.10 µm, but is not limited thereto.

Although it has been illustrated in the drawing that each of the first semiconductor layer 310 and the second semiconductor layer 320 is configured as one layer, but the present disclosure is not limited thereto. According to one or more embodiments, each of the first semiconductor layer 310 and the second semiconductor layer 320 may further include a larger number of layers, for example, a clad layer or a tensile strain barrier reducing (TSBR) layer, according to a material of the active layer 330. This will be described later with reference to other drawings.

The active layer 330 is disposed between the first semiconductor layer 310 and the second semiconductor layer 320. The active layer 330 may include a material having a single or multiple quantum well structure. When the active layer 330 includes the material having the multiple quantum well structure, the active layer 330 may have a structure in which a plurality of quantum layers and a plurality of well layers are alternately stacked. The active layer 330 may emit light by a combination of electron-hole pairs according to electrical signals applied through the first semiconductor layer 310 and the second semiconductor layer 320. As an example when the active layer 330 emits light of a blue wavelength band, the active layer 330 may include a material such as AlGaN or AlGaInN. In particular, when the active layer 330 has the multiple quantum well structure, that is, the structure in which the quantum layers and the well layers are alternately stacked, the quantum layers may include a material such as AlGaN or AlGaInN, and the well layers may include a material such as GaN or AlInN. In one or more embodiments, the active layer 330 may include AlGaInN as a material of the quantum layers and AlInN as a material of the well layers to emit the blue light having the central wavelength band of 450 nm to 495 nm, as described above.

However, the present disclosure is not limited thereto, and the active layer 330 may have a structure in which semiconductor materials having large band gap energy and semiconductor materials having small band gap energy are alternately stacked, and may include other Group III to Group V semiconductor materials according to a wavelength band of emitted light. The light emitted by the active layer 330 is not limited to the light of the blue wavelength band, and in some case, the active layer 330 may emit light of a red and green wavelength band. A length of the active layer 330 may be in the range of 0.05 μm to 0.10 μm, but is not limited thereto.

The light emitted from the active layer 330 may be emitted not only to outer surfaces of the light emitting element 300 in a length direction, but also to both side surfaces of the light emitting element 300. Directivity of the light emitted from the active layer 330 is not limited to one direction.

The electrode layer 370 may be an ohmic contact electrode. However, the present disclosure is not limited thereto, and the electrode layer 370 may also be a Schottky contact electrode. The light emitting element 300 may include at least one electrode layer 370. It has been illustrated in FIG. 7 that the light emitting element 300 includes one electrode layer 370, but the present disclosure is not limited thereto. In some cases, the light emitting element 300 may also include a larger number of electrode layers 370 or the electrode layer 370 may also be omitted. A description of a light emitting element 300 to be provided later may be similarly applied even though the number of electrode layers 370 is changed or the light emitting element 300 further includes another structure.

The electrode layer 370 may decrease resistance between the light emitting element 300 and the electrodes or the contact electrodes when the light emitting element 300 is electrically connected to the electrodes 210 and 220 or the contact electrodes 261 and 262. The electrode layer 370 may include a metal having conductivity. The electrode layer 370 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 370 may include a semiconductor material doped with an n-type or p-type dopant. The electrode layer 370 may include the same material or include different materials, but is not limited thereto.

The insulating film 380 is disposed to be around (e.g., surround) outer surfaces (e.g., outer peripheral or circumferential surfaces) of the plurality of semiconductor layers and the electrode layers described above. In one or more embodiments, the insulating film 380 may be disposed to be around (or to surround) at least an outer surface (e.g., an outer peripheral or circumferential surface) of the active layer 330, and may extend in one direction in which the light emitting element 300 extends. The insulating film 380 may serve to protect these members. As an example, the insulating film 380 may be formed to be around (e.g., surround) side surface portions of these members, but may be formed to expose both ends of the light emitting element 300 in the length direction.

It has been illustrated in the drawing that the insulating film 380 is formed to extend in the length direction of the light emitting element 300 to cover side surfaces of the first semiconductor layer 310 to the electrode layer 370, but the present disclosure is not limited thereto. The insulating film 380 may cover only outer surfaces (e.g., outer peripheral or circumferential surfaces) of some of the semiconductor layers as well as the active layer 330 or cover only a portion of an outer surface (e.g., an outer peripheral or circumferential surface) of the electrode layer 370, such that the outer surface of each electrode layer 370 may be partially exposed. In addition, the insulating film 380 may also be formed so that an upper surface thereof is rounded in cross section in an area adjacent to at least one end of the light emitting element 300.

A thickness of the insulating film 380 may be in the range of 10 nm to 1.0 μm, but is not limited thereto. The thickness of the insulating film 380 may be preferably about 40 nm.

The insulating film 380 may include materials having insulating properties, such as silicon oxide ($SiO_x$), silicon nitride ($SiN_x$), silicon oxynitride ($SiO_xN_y$), aluminum nitride (AlN), and aluminum oxide ($Al_2O_3$). Accordingly, an electrical short circuit that may occur when the active layer 330 is in direct contact with an electrode through which an electrical signal is transferred to the light emitting element 300 may be prevented. In addition, the insulating film 380 protects an outer surface (e.g.; outer peripheral or circumferential surface) of the light emitting element 300 as well as the active layer 330, and may thus prevent a decrease in luminous efficiency.

In addition, in one or more embodiments, an outer surface (e.g., an outer peripheral or circumferential surface) of the insulating film 380 may be surface-treated. The light emitting elements 300 may be jetted and aligned onto electrodes in a state in which they are dispersed in a suitable ink (e.g.; a set or predetermined ink) when the display device 10 is manufactured. Here, in order to maintain the light emitting elements 300 in a state in which the light emitting elements 300 are dispersed without being agglomerated with other adjacent light emitting elements 300 in the ink, a hydrophobic or hydrophilic treatment may be performed on a surface of the insulating film 380.

The light emitting element 300 may have a length h of 1 μm to 10 μm or 2 μm to 6 μm, and preferably 3 μm to 5 μm. In addition, a diameter of the light emitting element 300 may be in the range of 300 nm to 700 nm, and an aspect ratio of the light emitting element 300 may be 1.2 to 100. However, the present disclosure is not limited thereto, and the plurality of light emitting elements 300 included in the display device 10 may also have different diameters according to a difference in composition between the active layers 330. In one or more embodiments, the diameter of the light emitting element 300 may be about 500 nm.

In the display device 10 according to one or more embodiments, the bank structures 410 and 420 providing the area in which the light emitting elements 300 are disposed in the emission area EMA and the circuit elements for driving the light emitting elements 300 in the non-emission area NEA may be disposed at the same layer. In particular, the base layers 411 and 421 and the upper layers 412 and 422 of the bank structures 410 and 420 may be disposed at the same layer as the first gate electrode GE1 and the source/drain electrodes SDE1 and SDE2 of the first transistor TR1, respectively, and may thus be formed concurrently (e.g., simultaneously) with the first gate electrode GE1 and the source/drain electrodes SDE1 and SDE2 of the first transistor TR1, respectively, in one process. Accordingly, the number of manufacturing processes of the display device 10 according to one or more embodiments may be decreased.

Hereinafter, manufacturing processes of the display device 10 will be described with reference to other drawings. Hereinafter, a sequence of the manufacturing processes of the display device 10 will be described in detail, and a description of a method of forming respective members will be omitted.

FIGS. 8 to 15 are cross-sectional views illustrating one or more manufacturing processes of the display device according to one or more embodiments.

Figure 8:
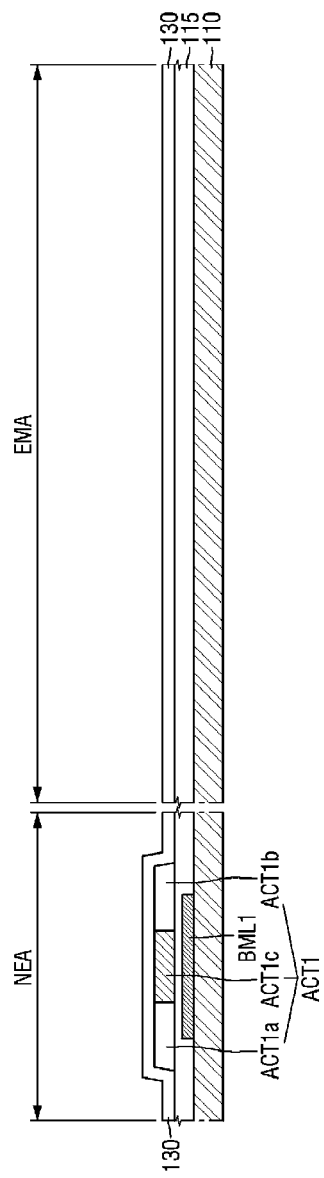
FIGS. 8 to 15 are cross-sectional views illustrating some of manufacturing processes of the display device according to one or more embodiments.

First, referring to FIG. 8, the first substrate 110 is prepared, and the first light blocking layer BML1, the buffer layer 115, the first active material layer ACT1, and a first gate insulating layer 130 disposed on the first substrate 110 are formed. The buffer layer 115 and the first gate insulating layer 130 are entirely disposed on the first substrate 110, and the first light blocking layer BML1 and the first active material layer ACT1 are disposed only in the non-emission areas NEA on the first substrate 110.

Figure 9:
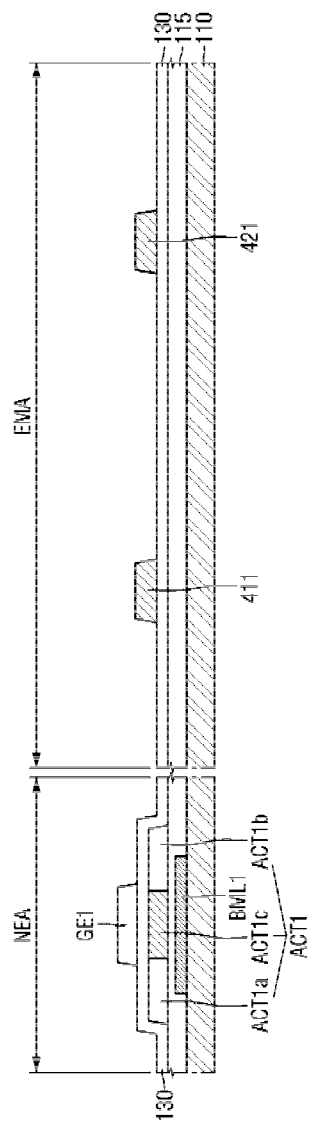

Next, referring to FIG. 9, the first gate conductive layer is formed on the first gate insulating layer 130. The first gate electrode GE1 disposed in the non-emission area NEA and the first base layer 411 and the second base layer 421 disposed in the emission area EMA are formed on the first gate insulating layer 130. As described above; the first gate electrode GE1 and the first and second base layers 411 and 421 may be included in the first gate conductive layer and disposed at the same layer, and may be concurrently (e.g., simultaneously) formed in one process.

Figure 10:
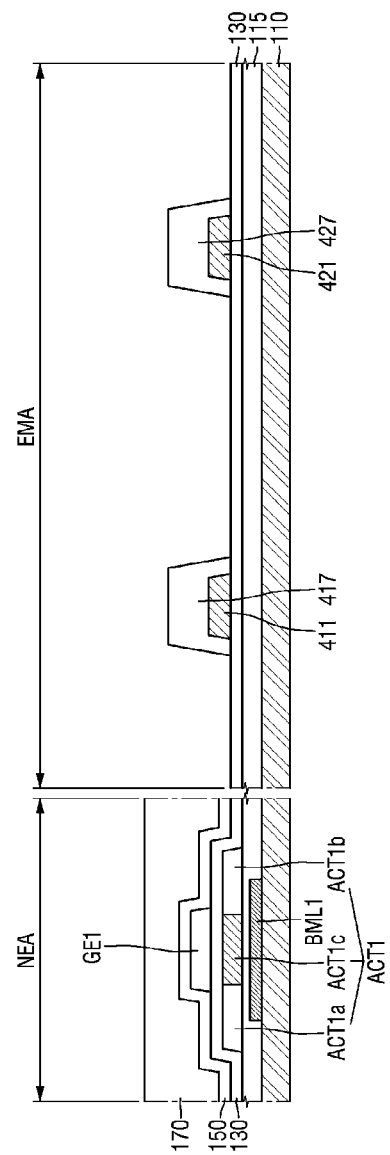

Next, referring to FIG. 10, the interlayer insulating layer is formed on the first gate conductive layer. The first interlayer insulating layer 170 entirely covering the non-emission area NEA and the first intermediate layer 417 disposed to cover the first base layer 411 and the second intermediate layer 427 disposed to cover the second base layer 421 in the emission area EMA are formed on the first gate conductive layer. As described above, the first interlayer insulating layer 170 and the first and second intermediate layers 417 and 427 may be included in the interlayer insulating layer and disposed at the same layer, and may be concurrently (e.g., simultaneously) formed in one process. In one or more embodiments, a first passivation layer 150 may be formed between the first gate electrode GE1 and the first interlayer insulating layer 170 in the non-emission area NEA.

Figure 11:
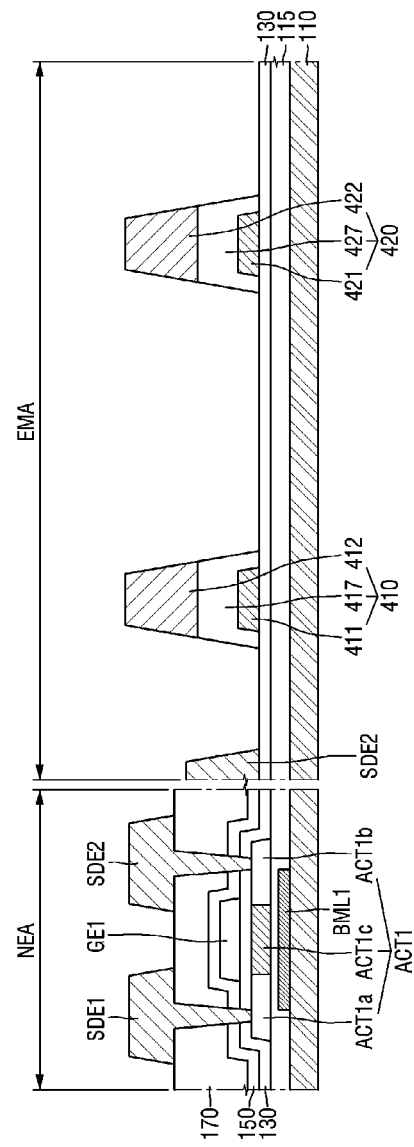

Next; referring to FIG. 11, the first data conductive layer is formed on the interlayer insulating layer 170. The first source/drain electrode SDE1 and the second source/drain electrode SDE2 of the first transistor TR1 disposed in the non-emission area NEA and the first upper layer 412 disposed on the first intermediate layer 417 and the second upper layer 422 disposed on the second intermediate layer 427 in the emission area EMA are formed on the interlayer insulating layer. As described above, the source/drain electrodes SDE1 and SDE2 of the first transistor TR1 and the first and second upper layers 412 and 422 may be included in the first data conductive layer and disposed at the same layer, and may be concurrently (e.g.; simultaneously) formed in one process. Through the processes described above, the first transistor TR1 may be formed in the non-emission area NEA, and the first bank structure 410 and the second bank structure 420 may be formed in the emission area EMA.

Figure 12:
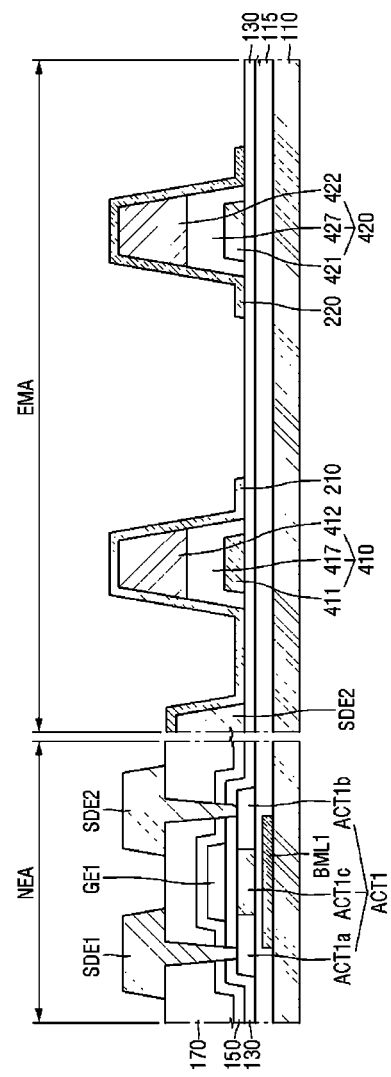
Figure 13:
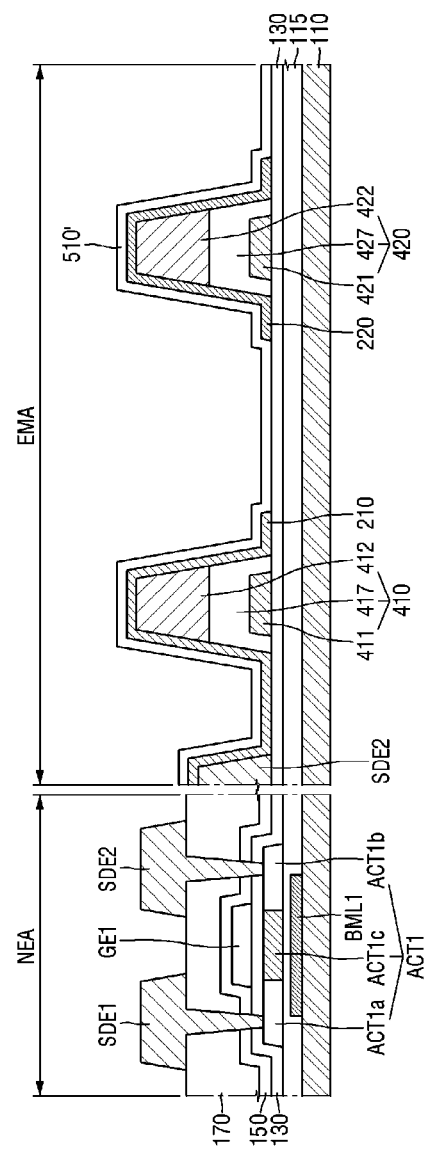

Next, referring to FIGS. 12 and 13, the first electrode 210 and the second electrode 220 are formed on the bank structures 410 and 420 of the emission area EMA, and a first insulating material layer 510' covering the first electrode 210 and the second electrode 220 is formed. Openings are not formed in the first insulating material layer 510' of FIG. 13, such that the first insulating material layer 510' may entirely cover the first electrode 210 and the second electrode 220.

In a subsequent process, the first insulating material layer 510' is partially etched, and openings exposing portions of the upper surfaces of the first electrode 210 and the second electrode 220 are formed, such that the first insulating layer 510 may be formed.

Figure 14:
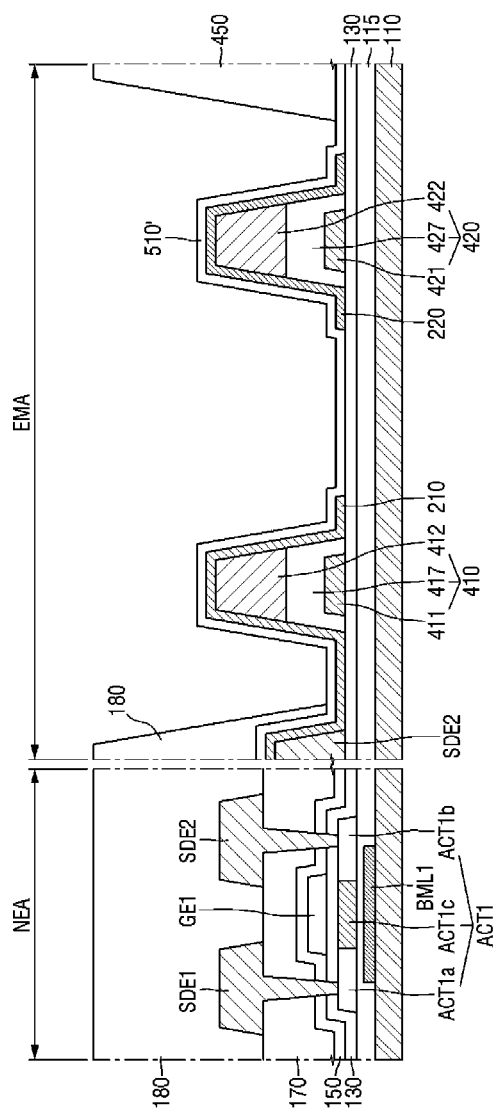

Next, referring to FIG. 14, the first planarization layer 180 disposed on the first data conductive layer of the non-emission area NEA and the external bank layer 450 disposed on the first insulating layer 510' of the emission area EMA are formed. As described above, the first planarization layer 180 and the external bank layer 450 are concurrently (e.g., simultaneously) formed in one process. In one or more embodiments, the first planarization layer 180 and the external bank layer 450 may be formed of an organic insulating material such as polyimide (PI), and heights of the first planarization layer 180 and the external bank layer 450, for example, heights from an upper surface of the first substrate 110 to upper surfaces of the first planarization layer 180 and the external bank layer 450 may be substantially the same as each other. However, the present disclosure is not limited thereto.

Figure 15:
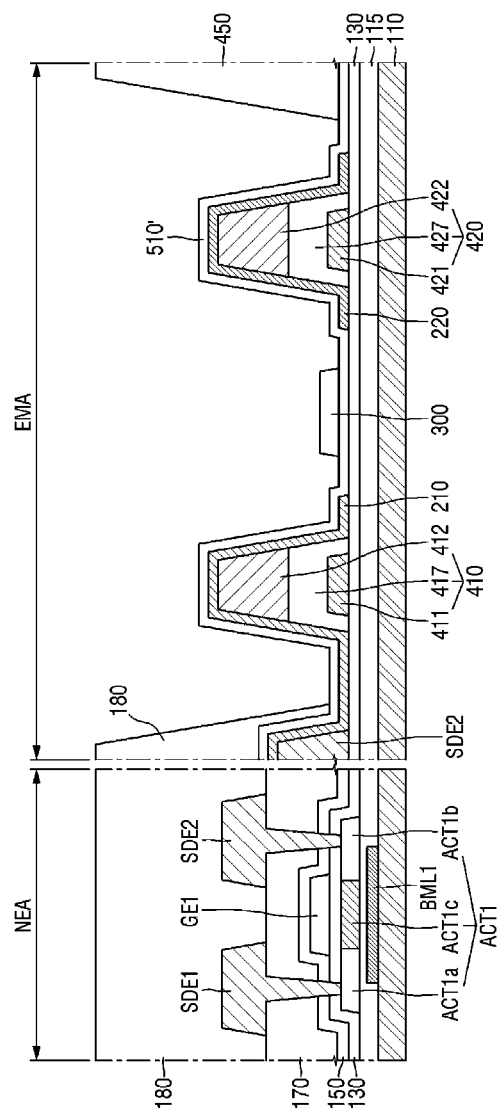

Next, referring to FIG. 15, the light emitting elements 300 are disposed between the first electrode 210 and the second electrode 220 or between the first bank structure 410 and the second bank structure 420. In one or more embodiments, the light emitting elements 300 may be jetted to the emission area EMA of each pixel PX or sub-pixel PXn in a state in which they are dispersed in a suitable ink (e.g., a set or predetermined ink) through an inkjet process, and may be aligned between the first and second electrodes 210 and 220 through a process of forming an electric field between the first and second electrodes 210 and 220. When the light emitting elements 300 dispersed in the ink are jetted to the emission area EMA and an alignment signal is applied to the first electrode 210 and the second electrode 220, an electric field may be formed between the first electrode 210 and the second electrode 220, and the light emitting elements 300 may receive a dielectrophoretic force due to the electric field. The light emitting elements 300 receiving the dielectrophoretic force may be aligned between the first electrode 210 and the second electrode 220 while their orientation directions and positions are changed in the ink.

Here, any one of the first electrode 210 and the second electrode 220 may be grounded, and alternating current (AC) power may be applied to the other ones of the first electrode 210 and the second electrode 220. For example, when the first electrode 210 is grounded and the AC power is applied to the second electrode 220, the AC power may be directly applied to the second electrode 220 rather than the second voltage line VSSL. The process of applying the AC power to the second electrode 220 as described above may be performed through a wiring connected to the second electrode 220 in the manufacturing processes of the display device 10, and a process of disconnecting the wiring may be subsequently performed.

Figure 16:
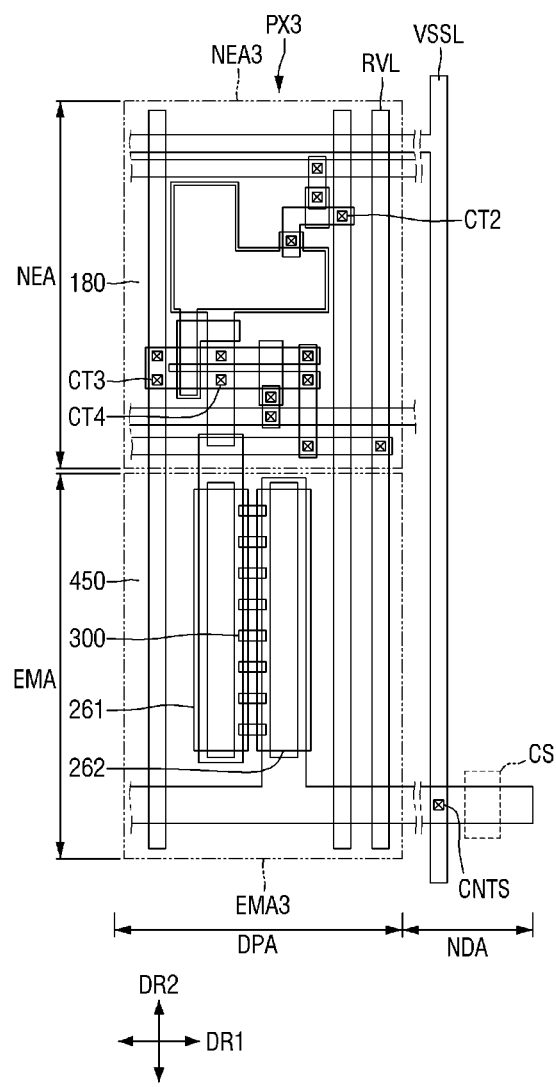
FIG. 16 is a plan view illustrating one step of the manufacturing processes of the display device according to one or more embodiments.

FIG. 16 is a plan view illustrating one step of the manufacturing processes of the display device according to one or more embodiments.

FIG. 16 illustrates that the second electrode stem part 220S is disposed to extend to the non-display area NDA in the manufacturing processes of the display device 10. Referring to FIG. 16, the second electrode stem part 220S extends in the first direction DR1, such that the second electrode 220 may also be disposed in the non-display area NDA, and the second electrode 220 may receive AC power applied through a pad disposed in the non-display area NDA. When the AC power is directly applied to the second electrode 220 through the pad, the AC power may be directly applied to the second electrode 220 without passing through wirings electrically connected to the second electrode 220, for example, the second voltage line VSSL. Accordingly, it is possible to prevent the circuit elements and the wirings of the display device 10 from being damaged due the AC power applied to the circuit elements and the wirings.

After the light emitting elements 300 are aligned between the first electrode 210 and the second electrode 220, a process of disconnecting a partial area CS (see FIG. 16) of the second electrode stem part 220S may be performed. When the display device 10 is driven, the second electrode 220 may receive only the second source voltage VSS through the second voltage line VSSL.

Next, the contact electrodes 261 and 262 disposed on the first electrode 210 and the second electrode 220 are formed to electrically connect the light emitting elements 300 and the first and second electrodes 210 and 220 to each other.

Figure 17:
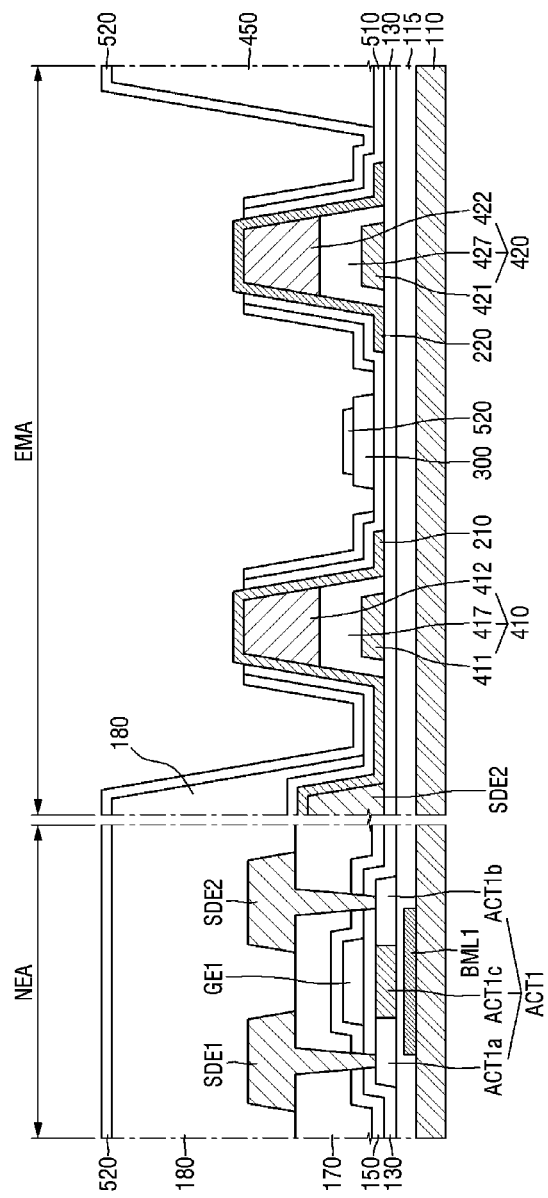
FIGS. 17 to 19 are cross-sectional views illustrating one or more manufacturing processes of the display device according to one or more embodiments.
Figure 18:
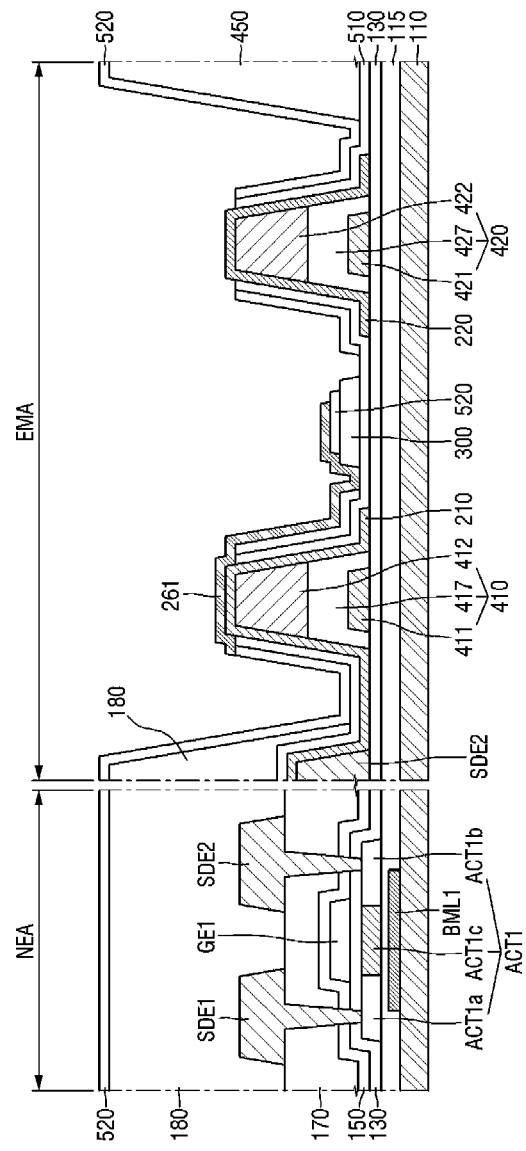
Figure 19:
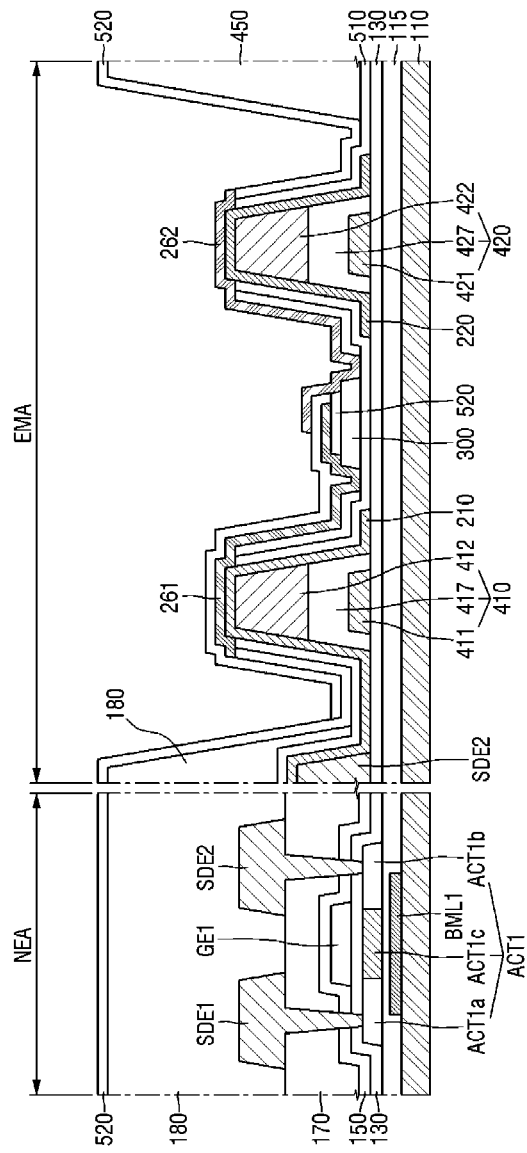

FIGS. 17 to 19 are cross-sectional views illustrating the other ones of manufacturing processes of the display device according to one or more embodiments.

First, referring to FIG. 17, the second insulating layer 520 is formed on the light emitting elements 300 and a partial area of the first insulating layer 510. Although not illustrated in the drawings, a shape of the second insulating layer 520 may be formed by entirely disposing an insulating material on the first insulating material layer 510' (see FIG. 15) and then performing a patterning process of exposing the first electrode 210 and the second electrode 220, and both ends of the light emitting elements 300. In the patterning process, the first insulating material layer 510' may also be partially removed, and accordingly, the first insulating layer 510 may be formed. It has been illustrated in the drawing that portions of upper surfaces of the first electrode 210 and the second electrode 220 are concurrently (e.g.; simultaneously) exposed, but the present disclosure is not limited thereto. In some cases, after a process of forming the first contact electrode 261 and the third insulating layer 530 to be described later is performed, a process of exposing a portion of the upper surface of the second electrode 220 may be performed.

In one or more embodiments, a process of disconnecting the partial area CS (see FIG. 16) of the second electrode 220 may be performed in the same process as a process of forming the second insulating layer 520. In the process of forming the second insulating layer 520, when the insulating material is formed to cover an upper surface of the first insulating material layer 510' and then patterned, the partial area CS (see FIG. 16) of the second electrode 220 may also be concurrently (e.g., simultaneously) patterned. In this case, the number of processes required between the process of disposing the light emitting elements 300 and the process of exposing portions of the first electrode 210 and the second electrode 220 may be further decreased.

Next, referring to FIGS. 18 and 19, the first contact electrode 261 disposed on the first electrode 210, the third insulating layer 530 disposed on the first contact electrode 261, and the second contact electrode 262 disposed on the second electrode 220 are formed. A description of arrangements and structures of the first contact electrode 261, the third insulating layer 530, and the second contact electrode 262 is the same as that described above.

Next, the fourth insulating layer 550 disposed to cover the members disposed on the first substrate 110 is formed, such that the display device 10 according to one or more embodiments may be manufactured.

Hereinafter, various embodiments of the display device 10 will be described.

Figure 20:
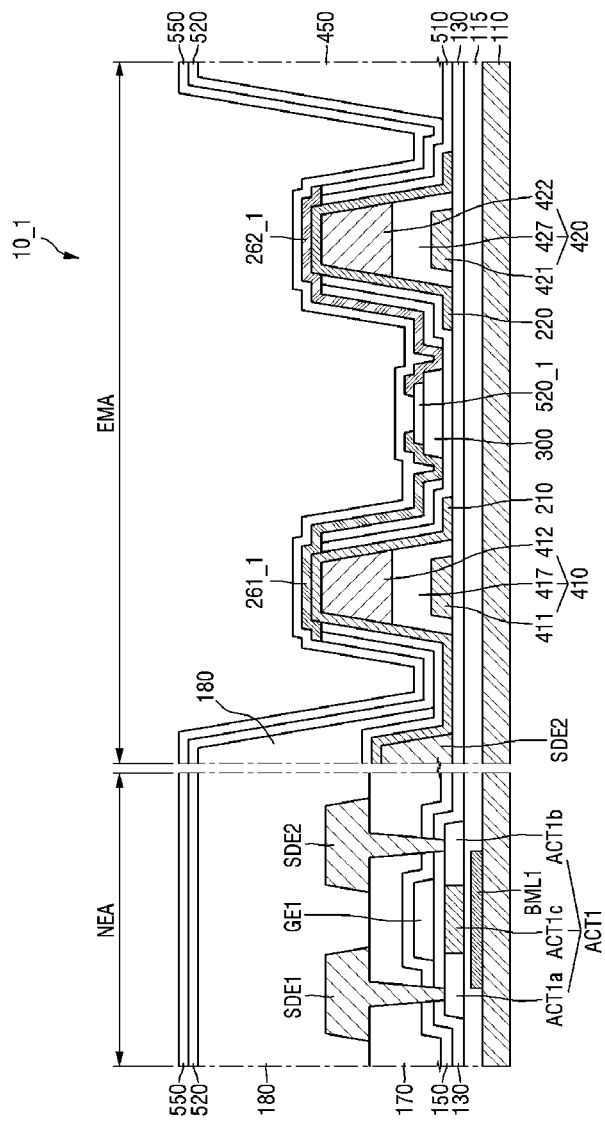
FIG. 20 is a cross-sectional view of a display device according to one or more embodiments.

FIG. 20 is a cross-sectional view of a display device according to one or more embodiments.

Referring to FIG. 20, in a display device 10_1 according to one or more embodiments, the third insulating layer 530 may be omitted. The present embodiment is different from an embodiment of FIG. 6 in that the third insulating layer 530 is omitted. Hereinafter, an overlapping description will be omitted, and contents different from those described above will be mainly described.

In the display device 10_1 of FIG. 20, the third insulating layer 530 may be omitted, and a second contact electrode 262 may be directly disposed on a second insulating layer 520_1. In one or more embodiments, when the second insulating layer 520_1 includes an organic insulating material, a first contact electrode 261_1 and the second contact electrode 262_1 may be concurrently (e.g., simultaneously) formed in one process. In a process of forming the second insulating layer 520_1 after disposing the light emitting elements 300, portions of the upper surfaces of the first electrode 210 and the second electrode 220 may be concurrently (e.g., simultaneously) exposed as illustrated in FIG. 17. Thereafter, the first contact electrode 261_1 and the second contact electrode 262_1 are concurrently (e.g., simultaneously) formed, but may be spaced from each other on the second insulating layer 520 disposed on the light emitting elements 300. Accordingly, a portion of a lower surface of the second contact electrode 262_1 may be in direct contact with the second insulating layer 520_1. In the display device 10_1 according to the present embodiment, the third insulating layer 530 is omitted and the first contact electrode 261_1 and the second contact electrode 262_1 are concurrently (e.g., simultaneously) formed in one process, such that the number of manufacturing processes of the display device 10_1 may be further decreased.

Figure 21:
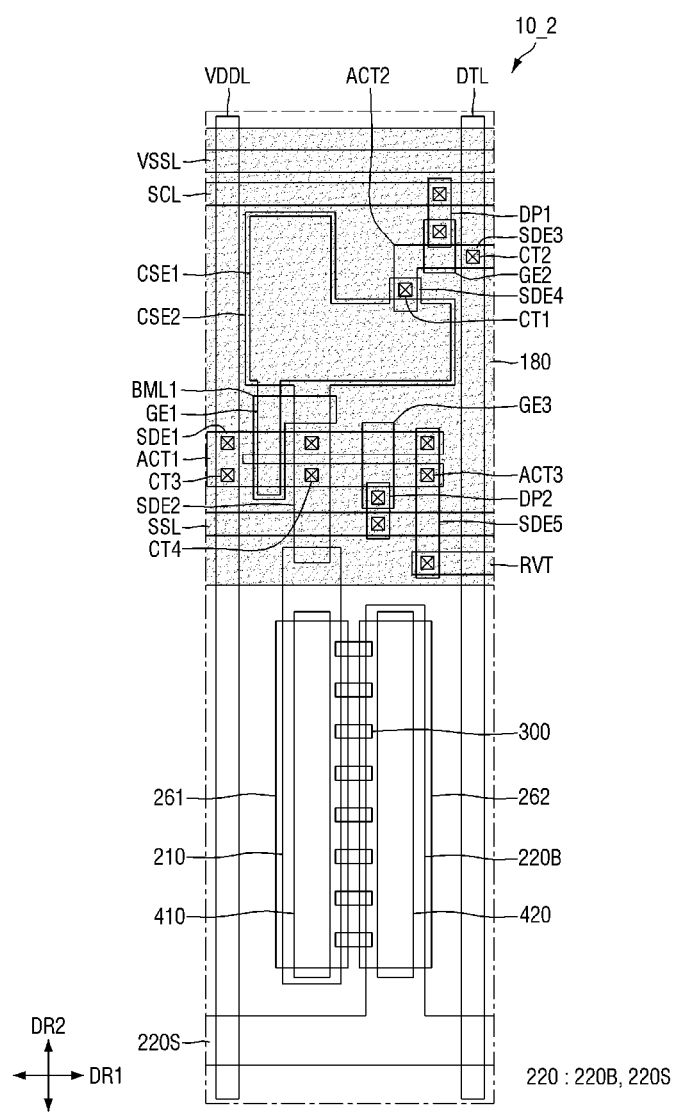
FIG. 21 is a layout diagram illustrating one pixel of a display device according to one or more embodiments.
Figure 22:
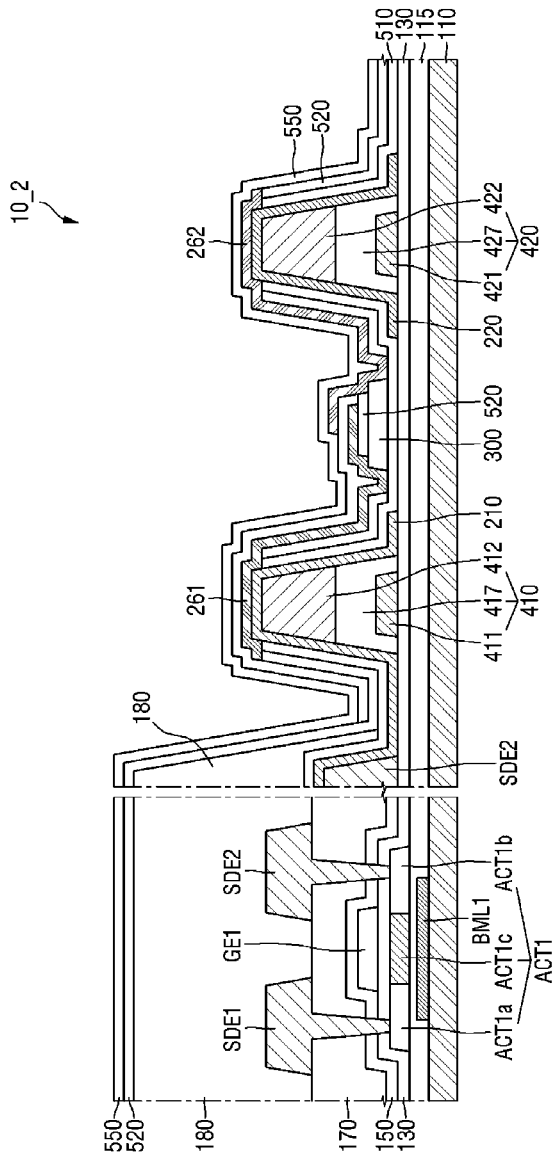
FIG. 22 is a cross-sectional view illustrating a portion of the display device of FIG. 21.

FIG. 21 is a layout diagram illustrating one pixel of a display device according to one or more embodiments. FIG. 22 is a cross-sectional view illustrating a portion of the display device of FIG. 21.

Referring to FIGS. 21 and 22, in a display device 10_2 according to one or more embodiments, the external bank layer 450 may be omitted. The present embodiment is different from an embodiment of FIG. 5 in that the external bank layer 450 is omitted. Hereinafter, an overlapping description will be omitted, and contents different from those described above will be mainly described.

In the display device 10_2 of FIGS. 21 and 22, the external bank layer 450 may be omitted. As described above, the external bank layer 450 may serve to prevent ink from overflowing into other sub-pixels SPXn in the inkjet process of disposing the light emitting elements 300, while dividing the respective sub-pixels PXn. However, in some cases, when the ink may be positioned in the emission area EMA of the sub-pixel PXn, the external bank layer 450 may be omitted. In addition, when it does not matter that the ink overflows into other sub-pixels PXn, for example, when the plurality of sub-pixels PXn include the same type of light emitting elements 300, the ink may be jetted to overflow to the plurality of sub-pixels PXn. In this case, the external bank layer 450 may be omitted, and only the first planarization layer 180 may be disposed on the non-emission area NEA.

Figure 23:
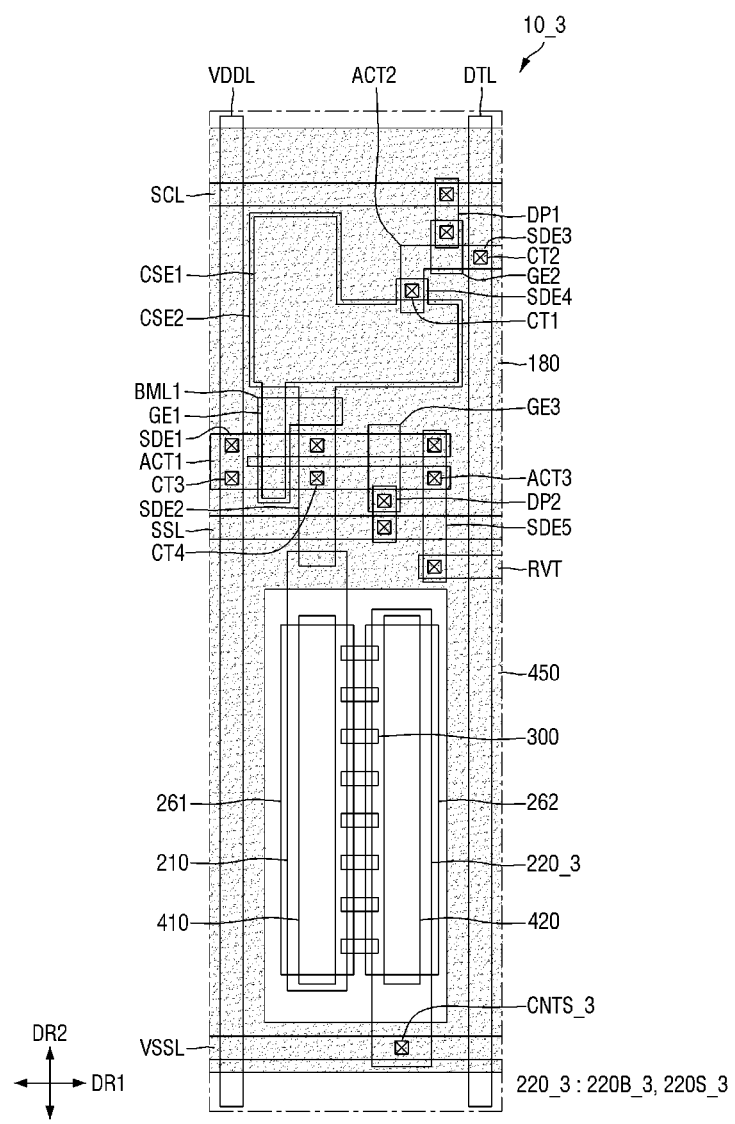
FIG. 23 is a layout diagram illustrating one pixel of a display device according to one or more embodiments.

FIG. 23 is a layout diagram illustrating one pixel of a display device according to one or more embodiments.

Referring to FIG. 23, in a display device 10_3 according to one or more embodiments, the second electrode stem part 220S_3 may be omitted, and the second electrode 220 may be electrically connected to the second voltage line VSSL through an electrode contact hole CNTS_3 formed for each sub-pixel PXn. The present embodiment is different from an embodiment of FIG. 5 in that the second electrode stem part 220S of the second electrode 220 is omitted. Hereinafter, an overlapping description will be omitted, and contents different from those described above will be mainly described.

In the display device 10_3 of FIG. 23, the second electrode stem part 220S may be omitted. The second electrode 220_3 may be disposed for each sub-pixel PXn like the first electrode 210, and the second electrodes 220_3 disposed in the plurality of sub-pixels PXn may be separated from each other. In this case, the second electrode 220_3 may extend in the second direction DR2 and may be electrically connected to the second voltage line VSSL disposed between the sub-pixels PXn neighboring to each other in the first direction DR1.

Specifically, referring to FIG. 5, the plurality of pixels PX or sub-pixels PXn may be arranged along the first direction DR1 and the second direction DR2, and also in a case of wirings disposed in each of the plurality of pixels PX or sub-pixels PXn, for example, the second voltage line VSSL, a plurality of wirings may extend in the first direction DR1. Accordingly, it has been illustrated in FIG. 5 that one second voltage line VSSL is disposed on the upper side of the non-emission area NEA of one pixel PX or sub-pixel PXn, but the second voltage line VSSL may also be disposed to extend on the lower side of the emission area BMA; as illustrated in FIG. 23. In this case, the second electrode 220_3 may extend in the second direction DR2 to partially overlap the second voltage line VSSL, and may be electrically connected to the second voltage line VSSL through the electrode contact hole CNTS_3 in an area in which the second electrode 220_3 overlaps the second voltage line VSSL. In one or more embodiments, the second voltage line VSSL may overlap a portion of the external bank layer 450 extending in the first direction DR1, and the electrode contact hole CNTS_3 through which the second electrode 220 and the second voltage line VSSL are connected to each other may be formed in an area in which the second voltage line VSSL overlaps the external bank layer 450. However, the present disclosure is not limited thereto.

As described above, the display device 10 may further include larger numbers of bank structures 410 and 420 or larger numbers of electrodes 210 and 220.

Figure 24:
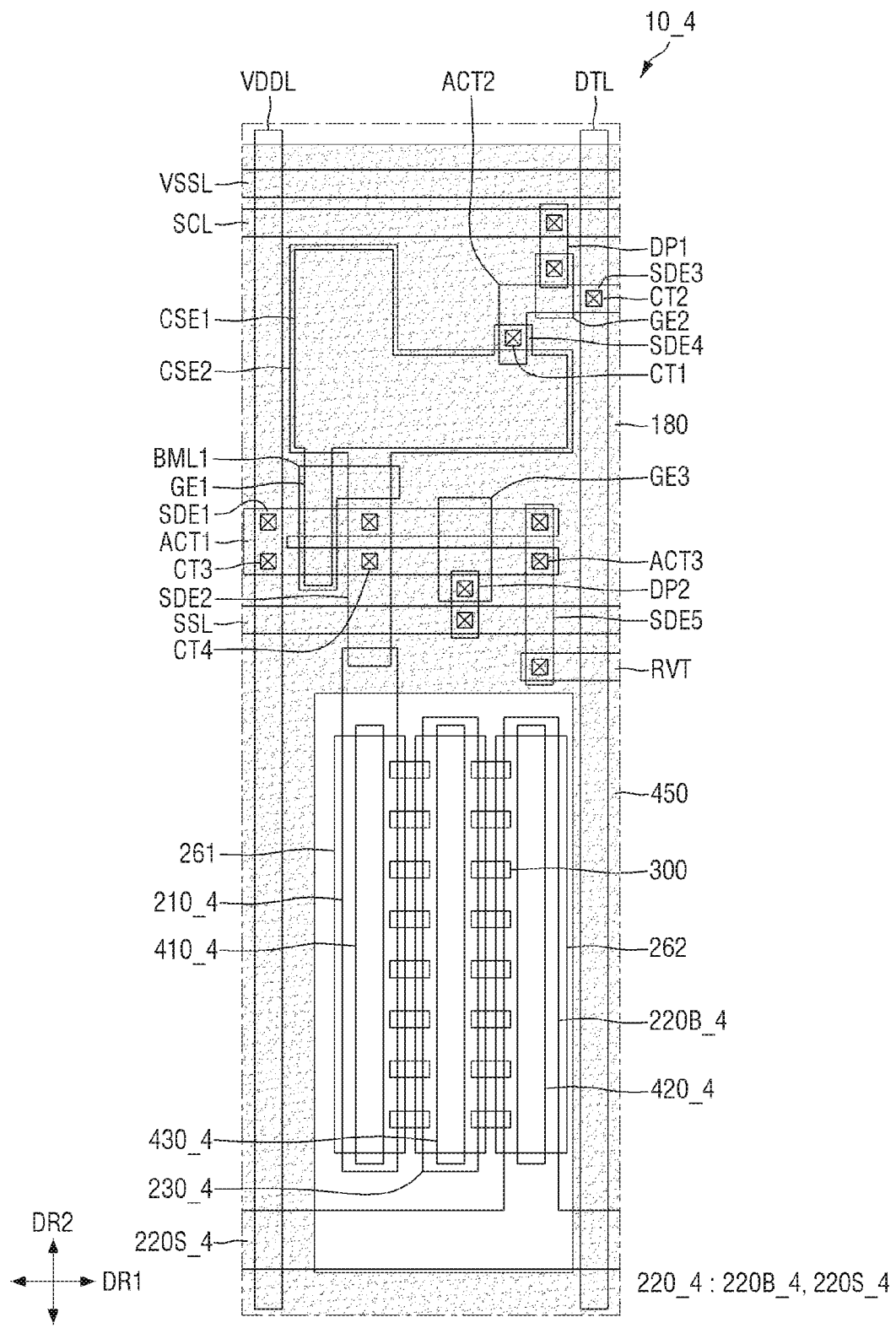
FIG. 24 is a layout diagram illustrating one pixel of a display device according to one or more embodiments.
Figure 25:
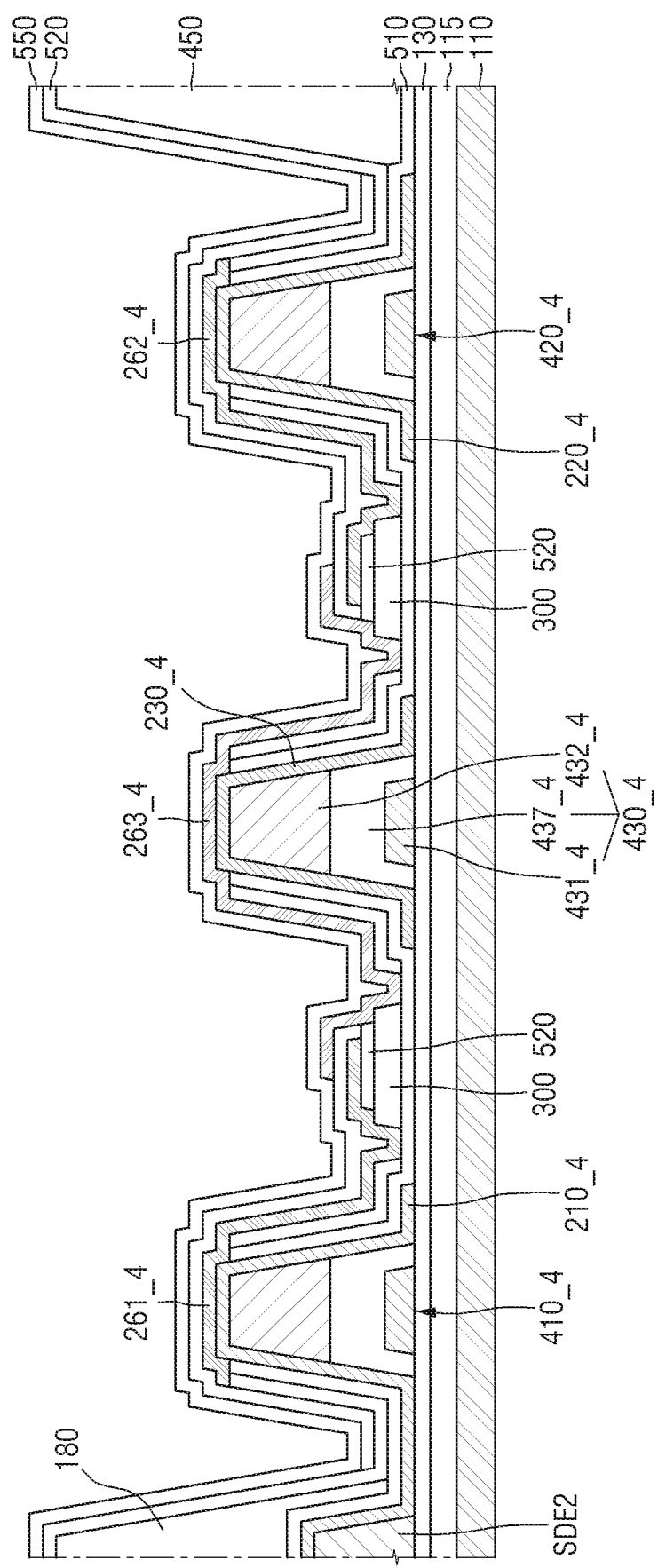
FIG. 25 is a cross-sectional view illustrating a portion of the display device of FIG. 24.

FIG. 24 is a layout diagram illustrating one pixel of a display device according to one or more embodiments. FIG. 25 is a cross-sectional view illustrating a portion of the display device of FIG. 24.

Referring to FIGS. 24 and 25, a display device 10_4 according to one or more embodiments may further include a third bank structure 430_4 disposed between a first bank structure 410_4 and a second bank structure 420_4, a third electrode 230_4 disposed between a first electrode 210_4 and a second electrode 220_4 and disposed on the third bank structure 430_4, and a third contact electrode 263_4 disposed between a first contact electrode 261_4 and a second contact electrode 262_4 and disposed on the third electrode 230_4. The present embodiment is different from an embodiment of FIGS. 5 and 6 in that it further includes the third bank structure 430_4 and the third electrode 230_4. Hereinafter, an overlapping description will be omitted, and contents different from those described above will be mainly described.

The display device 10_4 of FIGS. 24 and 25 may further include the third bank structure 430_4. The third bank structure 430_4 may have substantially the same structure as the first bank structure 410_4 and the second bank structure 420_4. That is, the third bank structure 430_4 may include a third base layer 431_4 disposed on the first gate conductive layer, a third intermediate layer 437_4 disposed to cover the third base layer 431_4, and a third upper layer 432_4 disposed on the third intermediate layer 437_4 and disposed at the first data conductive layer. A description of the third base layer 431_4, the third intermediate layer 437_4, and the third upper layer 432_4 is the same as that described above with respect to the first base layer 411_4, the first intermediate layer 417_4, and the first upper layer 412_7. The third bank structure 430_4 may be disposed to be spaced from and face (or oppose) the first bank structure 410_4 and the second bank structure 420_4 between the first bank structure 410_4 and the second bank structure 420_4, and may have a shape in which it extends in the second direction DR2 in the emission area EMA. Accordingly, areas in which the light emitting elements 300 are disposed may be formed between the first bank structure 410_4 and the third bank structure 430_4 and between the third bank structure 430_4 and the second bank structure 420_4, and a larger number of light emitting elements 300 may be disposed for each sub-pixel PXn.

The third electrode 230_4 is disposed on the third bank structure 430_4. The third electrode 230_4 may be formed so that a width thereof measured in one direction is greater than a width of the third bank structure 430_4 measured in the one direction, and may thus be formed to be around (or to surround) an outer surface of the third bank structure 430_4. In addition, the third electrode 230_4 may be formed on the third bank structure 430_4 so that a portion of an upper surface thereof is exposed like the first electrode 210_4, may extend in the second direction DR2, and may be disposed to be spaced from and face (or oppose) the first electrode 210_4 and the second electrode 220_4 between the first electrode 210_4 and the second electrode 220_4.

However, the third electrode 230_4 may not be electrically connected to the circuit elements or the wirings disposed in each pixel PX or sub-pixel PXn unlike the first electrode 210_4 and the second electrode 220_4. The first electrode 210_4 may be electrically connected to the second source/drain electrode SDE2 of the first transistor TR1, and the second electrode 220_4 may be electrically connected to the second voltage line VSSL, but the third electrode 230_4 may be a floating electrode that is not electrically connected to the second source/drain electrode SDE2 of the first transistor TR1 and the second voltage line VSSL. The third electrode 230_4 may be an electrode to which electrical signals applied from the circuit elements or the wirings are not directly transferred and electrical signals transferred to the first electrode 210_4 and the second electrode 220_4 flow.

The third contact electrode 263_4 may be further disposed on the third electrode 230_4. The third contact electrode 263_4 may be in contact with each of the light emitting elements 300 disposed between the first bank structure 410_4 and the third bank structure 430_4 and the light emitting elements 300 disposed between the third bank structure 430_4 and the second bank structure 420_4. The light emitting elements 300 disposed between the first bank structure 410_4 and the third bank structure 430_4 may each have one end in contact with the first contact electrode 261_4 and the other end in contact with the third contact electrode 263_4, and the light emitting elements 300 disposed between the third bank structure 430_4 and the second bank structure 420_4 may each have one end in contact with the third contact electrode 263_4 and the other end in contact with the second contact electrode 262_4. In addition, the third contact electrode 263_4 may also be in contact with the exposed upper surface of the third electrode 230_4. Accordingly, the light emitting elements 300 may be electrically connected to the third electrode 230_4 through the third contact electrode 263_4. It has been illustrated in the drawings that one third bank structure 430_4, one third electrode 230_4, and one third contact electrode 263_4 are disposed, but the present disclosure is not limited thereto and the numbers of third bank structures 430_4, third electrodes 230_4, and third contact electrodes 263_4 may be more than those illustrated in the drawings.

When an electrical signal is transferred through the first electrode 210_4, the electrical signal may be transferred to one ends of the light emitting elements 300 disposed between the first bank structure 410_4 and the third bank structure 430_4. The electrical signal may be transferred to the third contact electrode 263_4 and the third electrode 230_4, and may be transferred to the light emitting elements 300 disposed between the third bank structure 4304 and the second bank structure 420_4. The light emitting elements 300 disposed between the first bank structure 410_4 and the third bank structure 430_4 and the light emitting elements 300 disposed between the third bank structure 430_4 and the second bank structure 420_4 may receive the electrical signal only through the first electrode 210_4, respectively, and may be connected to each other in series. The display device 10_4 according to one or more embodiments may further improve luminous efficiency by further including the third bank structure 430_4, the third electrode 230_4, and the third contact electrode 263_4 and thus connecting some of the plurality of light emitting elements 300 to each other in series.

In addition, the display device 10 includes larger numbers of first electrodes 210 and first bank structures 410, such that a larger number of light emitting elements 300 may be disposed for each sub-pixel PXn, but these light emitting elements 300 may be connected to each other in parallel.

Figure 26:
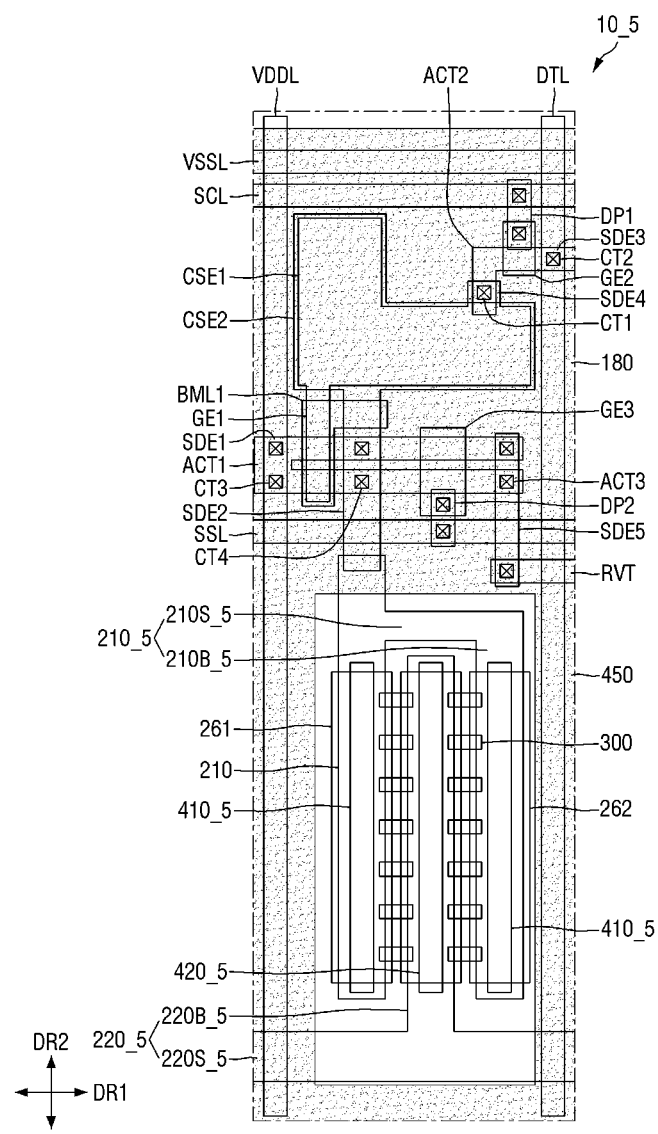
FIG. 26 is a layout diagram illustrating one pixel of a display device according to one or more embodiments.
Figure 27:
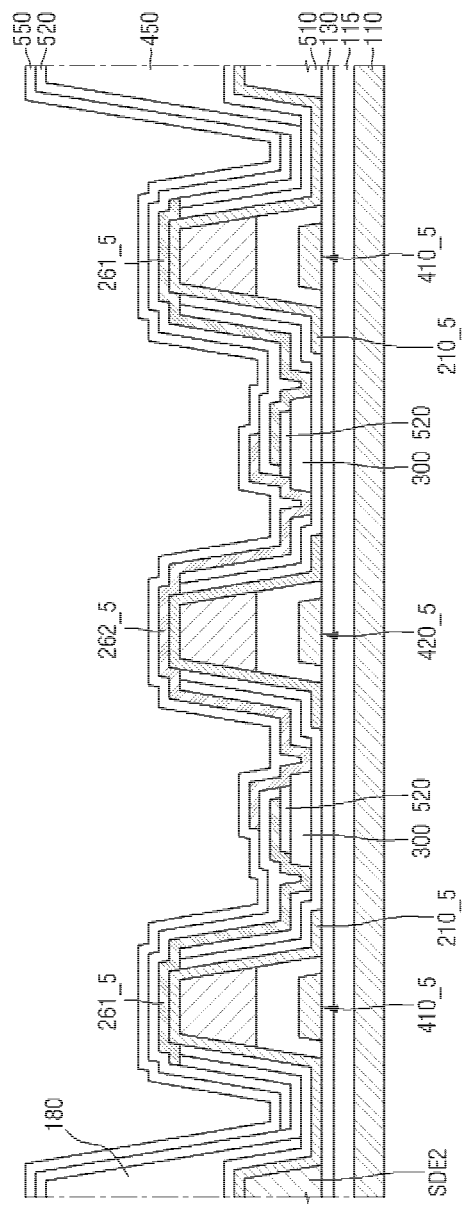
FIG. 27 is a cross-sectional view illustrating a portion of the display device of FIG. 26.

FIG. 26 is a layout diagram illustrating one pixel of a display device according to one or more embodiments. FIG. 27 is a cross-sectional view illustrating a portion of the display device of FIG. 26.

Referring to FIGS. 26 and 27, a display device 10_5 according to one or more embodiments may include a plurality of first bank structures 410_5, and a second bank structure 4206 may be disposed between the plurality of first bank structures 410_5. In addition, a first electrode 210_5 may include a first electrode stem part 210S_5 and first electrode branch parts 210B_5, and a second electrode 220_5 may include a second electrode branch part 220B_5 disposed between the first electrode branch parts 210B_5. The present embodiment is different from an embodiment of FIGS. 5 and 6 in that it further includes the plurality of first bank structures 410_5 and the first electrode 210_5. Hereinafter, an overlapping description will be omitted, and contents different from those described above will be mainly described.

The display device 10_5 of FIGS. 26 and 27 may include the plurality of first bank structures 410_5, and the second bank structure 420_5 may be disposed between the plurality of first bank structures 410_5. That is, the first bank structures 410_5 and the second bank structure 420_5 may be alternately disposed in the emission area EMA of each sub-pixel PXn, and may be spaced from and face (or oppose) each other. Areas in which the light emitting elements 300 are disposed are formed between the first bank structure 410_5 and the second bank structure 420_5 and between the second bank structure 420_5 and the first bank structure 410_5, such that a larger number of light emitting elements 300 may be disposed. That is, in the present embodiment, it may be understood that the first bank structure 410_5 spaced from the second bank structure 420_5 is further disposed on one side of the second bank structure 420_5 in the first direction DR1 in one or more embodiments of FIGS. 5 and 6.

The first electrode 210_5 may include the first electrode stem part 210S_5 extending in the first direction DR1 and a plurality of first electrode branch parts 210B_5 branching from the first electrode stem part 210S_5 in the second direction DR2. The first electrode branch parts 210B_5 may be disposed on the first bank structures 410_5, respectively, and the first electrode stem parts 210S_5 may connect the first electrode branch parts 210B_5 to each other. The first electrode 210_5 may be electrically connected to the first transistor TR1 through a portion protruding from one side of the first electrode stem part 210S_5, and may transfer an electrical signal to each of the first electrode branch parts 210B_5.

The second electrode 220_5 includes a second electrode stem part 220S_5 and the second electrode branch part 220B_5. The second electrode branch part 220B_5 may be disposed on the second bank structure 420_5 and both sides of the second electrode branch part 220B_5 may be spaced from and face (or oppose) the first electrode branch parts 210B_5, respectively. That is, in the present embodiment, it may be understood that the first electrode branch part 210B_5 spaced from the second electrode branch part 220B_5 is further disposed on one side of the second electrode branch part 220B_5 in the first direction DR1 and the respective first electrode branch parts 210B_5 are electrically connected to each other through the first electrode stem part 210S_5, in an embodiment of FIGS. 26 and 27.

In addition, first contact electrodes 261_5 may be disposed on the first electrode branch parts 210B_5. Unlike FIG. 5, a larger number of first contact electrodes 261_5 may be disposed.

The light emitting elements 300 may be disposed in each of areas formed between the first bank structures 410_5 and the second bank structure 420_5, and at least one end of each of the light emitting elements 300 may be electrically connected to the first electrode branch part 210B_5 through the first contact electrode 261_5. Unlike an embodiment of FIGS. 24 and 25, in the present embodiment, the light emitting elements 300 disposed in different areas may have at least one ends electrically connected to the first electrode branch parts 210B_5, respectively, and thus, may concurrently (e.g., simultaneously) receive electrical signals from the first transistor TR1. In addition, the light emitting elements 300 disposed in the different areas may have the other ends electrically connected to the second electrode branch part 220B_5, and may concurrently (e.g., simultaneously) receive electrical signals from the second voltage line VSSL. That is, the light emitting elements 300 according to the present embodiment may be connected to each other in parallel. A description of other members is the same as that described above, and a detailed description of other members will thus be omitted.

In concluding the detailed description, those skilled in the art will appreciate that many variations and modifications can be made to the embodiments without substantially departing from the scope and principles of the present disclosure. Therefore, the disclosed embodiments of the present disclosure are used in a generic and descriptive sense only and not for purposes of limitation.

What is claimed is:

1. A display device comprising:
a substrate;
a first bank structure and a second bank structure spaced from each other on the substrate;
a first electrode on the first bank structure and a second electrode on the second bank structure;
a light emitting element located between the first electrode and the second electrode; and
wherein the first bank structure comprises a base layer, an upper layer on the base layer, and an intermediate layer between the base layer and the upper layer,
wherein the first electrode covers the first bank structure,
wherein an emission area and a non-emission area are defined in the substrate,
wherein the first bank structure, the second bank structure, and the light emitting element are located in the emission area,
wherein the display device further comprises a first transistor in the non-emission area of the substrate and comprising a first active material layer, a first gate electrode on the first active material layer, and a source/drain electrode in contact with at least a partial area of the first active material layer, and
wherein the first gate electrode is at a same layer as the base layer of the first bank structure.

2. The display device of claim 1, wherein the source/drain electrode of the first transistor is at the same layer as the upper layer of the first bank structure.

3. The display device of claim 2, wherein the first electrode is at least partially located in the non-emission area, and
wherein a portion of the first electrode located in the non-emission area is in contact with the source/drain electrode of the first transistor.

4. The display device of claim 1, further comprising a third bank structure in the emission area of the substrate and located between the first bank structure and the second bank structure, and a third electrode on the third bank structure.

5. The display device of claim 4, wherein the light emitting element comprises a first light emitting element located between the first bank structure and the third bank structure and a second light emitting element located between the third bank structure and the second bank structure,
the first light emitting element comprises one end electrically connected to the first electrode, and
the second light emitting element comprises one end electrically connected to the second electrode.

6. The display device of claim 1, further comprising a first planarization layer on the source/drain electrode in the non-emission area and an external bank layer surrounding the first bank structures in the emission area.

7. The display device of claim 6, wherein a height from an upper surface of the substrate to an upper surface of the first planarization layer is substantially the same as a height from the upper surface of the substrate to an upper surface of the external bank layer.

8. The display device of claim 1, wherein the intermediate layer of the first bank structure surrounds an outer surface of the base layer.

9. The display device of claim 8, wherein the upper layer overlaps at least a partial area of the base layer in a thickness direction with the intermediate layer interposed therebetween.

10. The display device of claim 1, further comprising a first insulating layer on at least partial areas on the first electrode and the second electrode,
wherein the first insulating layer is located so as not to overlap at least a partial area of a portion of the first electrode located on the first bank structure in a direction perpendicular to an upper surface of the substrate.

11. The display device of claim 10, further comprising a second insulating layer on at least a partial area of the first insulating layer,
wherein the second insulating layer is located so that a portion of the first electrode that does not overlap the first insulating layer is exposed.

12. The display device of claim 11, wherein the light emitting element is located on the first insulating layer, and
wherein at least a portion of the second insulating layer is located on the light emitting element, and is located so that both ends of the light emitting element are exposed.

13. The display device of claim 12, further comprising a first contact electrode on the first electrode and a second contact electrode on the second electrode,
wherein the first contact electrode is in direct contact with a portion of the first electrode that does not overlap the first insulating layer and the second insulating layer, and is in direct contact with the exposed one end of the light emitting element.

14. A display device comprising:
a substrate including an emission area and a non-emission area;
a first semiconductor layer in the non-emission area of the substrate and comprising a first active material layer of a first transistor;
a first gate insulating layer on the substrate and the first semiconductor layer;
a first gate conductive layer on the first gate insulating layer and comprising a first gate electrode of the first transistor in the non-emission area and a plurality of base layers in the emission area;
an interlayer insulating layer comprising a first interlayer insulating layer on the first gate electrode and a plurality of intermediate layers covering the plurality of base layers;
a first data conductive layer comprising a source/drain electrode of the first transistor on the first interlayer insulating layer and a plurality of upper layers located on the intermediate layer;
a plurality of electrodes having at least partial areas on the upper layers and spaced from and opposing each other; and
at least one light emitting element located between the plurality of electrodes.

15. The display device of claim 14, wherein the plurality of base layers comprises a first base layer and a second base layer spaced from each other,
wherein the plurality of intermediate layers comprises a first intermediate layer covering the first base layer and a second intermediate layer covering the second base layer, and
wherein the plurality of upper layers comprises a first upper layer on the first intermediate layer and a second upper layer on the second intermediate layer.

16. The display device of claim 15, wherein the plurality of electrodes comprises a first electrode on the first upper layer and covering the first base layer and the first intermediate layer and a second electrode on the second upper layer and covering the second base layer and the second intermediate layer, and wherein the light emitting element is electrically connected to the first electrode and the second electrode.

17. The display device of claim 16, further comprising a first contact electrode on the first electrode and a second contact electrode on the second electrode, wherein the first contact electrode is in direct contact with the first electrode and one end of the light emitting element, and wherein the second contact electrode is in direct contact with the second electrode and the other end of the light emitting element.

18. The display device of claim 17, wherein the first electrode is at least partially located in the non-emission area, and a portion of the first electrode located in the non-emission area is in contact with the source/drain electrode of the first transistor.

19. The display device of claim 16, further comprising a first insulating layer covering at least partial areas on the first electrode and the second electrode, wherein the light emitting element is on the first insulating layer.

20. The display device of claim 19, further comprising a second insulating layer on at least a partial area of the first insulating layer, wherein at least a portion of the second insulating layer is on the light emitting element, and is located so that both ends of the light emitting element are exposed.

21. The display device of claim 14, further comprising a planarization layer on the first data conductive layer, wherein the planarization layer comprises a first planarization layer covering the non-emission area and an external bank layer surrounding an outer surface of the emission area.

* * * * *